United States Patent
Hilgers et al.

(10) Patent No.: US 11,302,858 B2
(45) Date of Patent: Apr. 12, 2022

(54) EAP ACTUATOR AND DRIVE METHOD

(71) Applicant: KONINKLIJKE PHILIPS N.V., Eindhoven (NL)

(72) Inventors: Achim Hilgers, Alsdorf (DE); Daan Anton Van Den Ende, Breda (NL); Mark Thomas Johnson, Arendonk (BE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 660 days.

(21) Appl. No.: 16/094,489

(22) PCT Filed: Apr. 25, 2017

(86) PCT No.: PCT/EP2017/059825
§ 371 (c)(1),
(2) Date: Oct. 18, 2018

(87) PCT Pub. No.: WO2017/186735
PCT Pub. Date: Nov. 2, 2017

(65) Prior Publication Data
US 2020/0328340 A1    Oct. 15, 2020

(30) Foreign Application Priority Data

Apr. 25, 2016  (EP) ..................................... 16166870

(51) Int. Cl.
*H01L 41/04*   (2006.01)
*H01L 41/09*   (2006.01)
*H01L 41/193*  (2006.01)

(52) U.S. Cl.
CPC ............ *H01L 41/042* (2013.01); *H01L 41/09* (2013.01); *H01L 41/193* (2013.01)

(58) Field of Classification Search
CPC .............................. H01L 41/042; H01L 41/09
(Continued)

(56) References Cited

U.S. PATENT DOCUMENTS 5,923,546 A    7/1999  Shimada et al.
2006/0231311 A1  10/2006  Fujii et al.
(Continued)

FOREIGN PATENT DOCUMENTS

JP    20040223770 A    8/2004
JP    2005-054658 A    3/2005
JP    2010-239701 A    10/2010

OTHER PUBLICATIONS

Xiang, X., Alici, G., Mutlu, R., & Li, W. (2014). How the type of input function affects the dynamic response of conducting polymer actuators. Smart Materials and Structures, 23, 11.
(Continued)

*Primary Examiner* — Derek J Rosenau
(74) *Attorney, Agent, or Firm* — Schott, P.C.

(57) ABSTRACT

A field driven electroactive polymer actuator which is actuated using an actuation drive having a profiled portion having a start voltage and an end voltage and a duration of at least 25 ms followed by a steady state drive portion based on a steady state voltage. The profiled portion comprises a voltage curve or a set of voltage points which define a first voltage slope at the beginning of the profiled portion which is steeper than a linear ramp between the start voltage and the end voltage, and a second voltage slope at the end of the profiled portion which is shallower than a linear ramp between the start voltage and the end voltage.

20 Claims, 16 Drawing Sheets

(58) Field of Classification Search
USPC .......................................................... 310/317
See application file for complete search history.

(56) References Cited

U.S. PATENT DOCUMENTS

| | | | |
|---|---|---|---|
| 2007/0152974 A1 | 7/2007 | Kim et al. | |
| 2007/0200467 A1* | 8/2007 | Heydt .................... | H04R 19/02 310/311 |
| 2007/0247023 A1* | 10/2007 | Tanimura ............... | H02N 2/145 310/316.01 |
| 2010/0007704 A1* | 1/2010 | Nitta ...................... | B41J 2/0452 347/68 |
| 2013/0100575 A1 | 4/2013 | O'Brien | |
| 2014/0084751 A1* | 3/2014 | Suzuki ................... | H02N 2/025 310/317 |

OTHER PUBLICATIONS

Mallavarapu et al, in Journal of Intelligent Material Systems and Structures, vol. 12, 2001, pp. 143-155.

\* cited by examiner

EAP ACTUATOR AND DRIVE METHOD

CROSS-REFERENCE TO PRIOR APPLICATIONS

This application is the U.S. National Phase application under 35 U.S.C. § 371 of International Application No. PCT/EP2017/059825, filed on Apr. 25, 2017, which claims the benefit of EP Patent Application No. EP 16166870.2, filed on Apr. 25, 2016. These applications are hereby incorporated by reference herein.

FIELD OF THE INVENTION

This invention relates to EAP actuators, and methods for driving EAP actuators.

BACKGROUND OF THE INVENTION

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

Field-driven EAPs are actuated by an electric field through direct electromechanical coupling. They usually require high fields (volts per meter) but low currents. Polymer layers are usually thin to keep the driving voltage as low as possible. Ionic EAPs are activated by an electrically induced transport of ions and/or solvent. They usually require low voltages but high currents. They require a liquid/gel electrolyte medium (although some material systems can also operate using solid electrolytes). Both classes of EAP have multiple family members, each having their own advantages and disadvantages.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C-C bond length. As a result, expansion and contraction of single CNT can be observed.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

Together, the electrodes, electroactive polymer layer, and carrier may be considered to constitute the overall electroactive polymer structure.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

An electroactive polymer structure as described above may be used both for actuation and for sensing. The most prominent sensing mechanisms are based on force measurements and strain detection. Dielectric elastomers, for example, can be easily stretched by an external force. By putting a low voltage on the sensor, the strain can be measured as a function of voltage (the voltage is a function of the area).

Another way of sensing with field driven systems is measuring the capacitance-change directly or measuring changes in electrode resistance as a function of strain.

Piezoelectric and electrostrictive polymer sensors can generate an electric charge in response to applied mechanical stress (given that the amount of crystallinity is high enough to generate a detectable charge). Conjugated polymers can make use of the piezo-ionic effect (mechanical stress leads to exertion of ions). CNTs experience a change of charge on the CNT surface when exposed to stress, which can be measured. It has also been shown that the resistance of CNTs change when in contact with gaseous molecules (e.g. $O_2$, $NO_2$), making CNTs usable as gas detectors.

When an EAP actuator is activated, a certain time delay caused by the capacitive behavior occurs. Approximately, the EAP-response follows a non-linear, exponential function, which essentially is very similar to the charging curve of a capacitor.

To reach a certain position of the EAP, this capacitive charge needs to reach a corresponding level as well. Such a charging level is reached after a certain multiple of the time constant $\tau$. Usually, after a time duration of $5\tau$, the maximum extension (or end position) is reached. For applications where a fast response is needed with a limited delay time, or a higher frequency of operation is required, this behavior might be a disadvantage and would hinder the usage of EAPs.

Electro Active Polymers (EAPs) can be used in several applications where different requirements in terms of precision may exist. For example, if used as a simple haptic feedback device it is not important how the EAP reacts; it may be sufficient that it reacts at all and hence a feedback is given. However, in certain applications a very high precision may be required, where the EAP needs to be activated very accurately. In such cases, ideally a step-like mechanical deformation is desired. This would be the case, for example, if the EAP is to be used as an on-off switch. As a function of the input signal, the EAP needs to change its mechanical state from a first (non-activated) state to a second (activated) state. Alternatively, there are applications where actuation without jitter is required for example in steering devices such as catheters.

However for some EAPs, a very specific behavior has been observed. If operated by a rectangular driving voltage, the mechanical deformation (activation) shows a very strong oscillating performance as presented in FIG. 3.

The top image shows the actuation voltage versus time, and the bottom image shows the mechanical response versus time. This may result in significant problems in some applications such as where very precise on-off states need to be provided. Usually a certain threshold value to separate between the off and on states is defined. If the device oscillates around this threshold value, the switching state is not defined and the switch itself will be jittering. For steering applications, the problem is an undefined (and at some points incorrect) steering direction. Therefore it would be of great benefit, if an EAP could be activated as fast as possible but without any oscillations during the activation phase.

The paper by Xiang, X., Alici, G., Mutlu, R., & Li, W. (2014); "How the type of input function affects the dynamic response of conducting polymer actuators" Smart Materials and Structures, 23, 11 discloses a method to improve the command following ability of a conducting polymer actuator, while minimizing the electric power consumption. A smooth input has been found to consume less electrical power than sharp inputs such as a step input with discontinuous higher-order derivatives. This work relates to slowly responding current driven (ionic) actuators for which oscillations during the activation phase do not arise.

This invention relates in particular to field driven electroactive polymer actuators, which are able to respond at high frequencies and consequently have been found to suffer from oscillation issues.

SUMMARY OF THE INVENTION

The invention is defined by the claims.

According to examples in accordance with an aspect of the invention, there is provided a field driven electroactive polymer actuator, comprising:

an electroactive polymer structure; and a driver for providing an actuation drive signal to the electroactive polymer structure, wherein the driver is adapted to:

provide a drive voltage for charging the electroactive polymer structure from a non-actuated state to an actuated state, wherein the drive voltage comprises a profiled portion having a start voltage and an end voltage and a duration of at least 1 ms followed by a steady state drive portion based on a steady state voltage, wherein the profiled portion comprises a voltage curve or a set of voltage points which define a first voltage slope at the beginning of the profiled portion which is steeper than a linear ramp between the start voltage and the end voltage, and a second voltage slope at the end of the profiled portion which is shallower than a linear ramp between the start voltage and the end voltage.

This arrangement is for low frequency voltage actuated EAP actuators. Instead of actuating using a square voltage waveform, the initial part of the actuation voltage has a profiled shape, so that the general envelope of the waveform starts with a steep slope (steeper than a straight ramp but less steep than a step) and this slope decays towards the end of the profiled portion. In this way, oscillations can be prevented while still maintaining a switching period which is as short as possible for the particular EAP technology. The specific shape of the profiled portion may be selected to find the best compromise between the suppression of oscillations and the speed of response.

The steady state drive portion is "based on" a steady state voltage in that there is a prevailing drive voltage, but there may be a superimposed compensation signal as explained further below.

The profiled portion starts with the start voltage and ends with the end voltage, but has intermediate voltage values at all times between.

The driver may be adapted to provide a profiled portion which follows an initial step voltage increase from zero to the start voltage, wherein the initial step voltage increase is at most 50% of the end voltage, for example less than 25% of the end voltage. This initial step may enable a reduced overall response time. By keeping the height of the initial step (from zero up to the start voltage of the profiled portion) less than half of the overall step, oscillations may still be prevented or reduced. A compromise may be found between the reduction in oscillations and the response actuation speed.

The driver may be adapted to provide a profiled portion which comprises a smooth curve with monotonically decreasing gradient. Alternatively, the profiled portion may comprise a set of at least 4 voltage steps between voltage points or a set of at least 4 constant slope portions between voltage points. Thus, the profiled portion does not need to be a locally smooth curve—it may have local discrete steps. If these local steps are kept small enough, they do not influence the effect of the overall profiled shape. This may make the voltage profile easier to generate in practice.

The driver may be adapted to provide a profiled portion which has a duration of between 10 ms and 200 ms, for example between 25 ms and 100 ms.

The driver may be adapted to provide:
the end voltage which is equal to the steady state voltage; or
a step increase from the end voltage to the steady state voltage, for example with a step increase of at most 25% of the end voltage.

Thus, the end of the profiled portion may be the steady state voltage. However, there may instead be a final step to the steady state voltage.

The driver may be adapted to provide a compensation waveform which is superposed over the profiled portion or over the steady state voltage. This compensation waveform may for example comprise a sine wave. This may be used to compensate for the particular oscillation response of a specific actuator.

The driver may be adapted to provide a profiled portion which comprises:
a parabolic curve;
an exponential curve; or
a root curve.

This is just one set of possible functions which can be used to implement a monotonically decreasing gradient.

Examples in accordance with another aspect of the invention provide a method of driving a field driven electroactive polymer actuator structure, comprising:

providing an actuation drive signal to the electroactive polymer structure, comprising:
a profiled portion having a start voltage and an end voltage and a duration of at least 1 ms followed by a steady state drive portion based on a steady state voltage, wherein the profiled portion comprises a voltage curve or a set of voltage points which define a first voltage slope at the beginning of the profiled portion which is steeper than a linear ramp between the start voltage and the end voltage, and a second voltage slope at the end of the profiled portion which is shallower than a linear ramp between the start voltage and the end voltage.

The method may comprise providing a profiled portion which follows an initial step voltage increase from zero to the start voltage, wherein the initial step voltage increase is at most 50% of the end voltage, for example less than 25% of the end voltage; and/or providing a compensation waveform which is superposed over the profiled portion or over the steady state voltage.

BRIEF DESCRIPTION OF THE DRAWINGS

Examples of the invention will now be described in detail with reference to the accompanying drawings, in which.

DETAILED DESCRIPTION OF THE EMBODIMENTS

Figure 1:
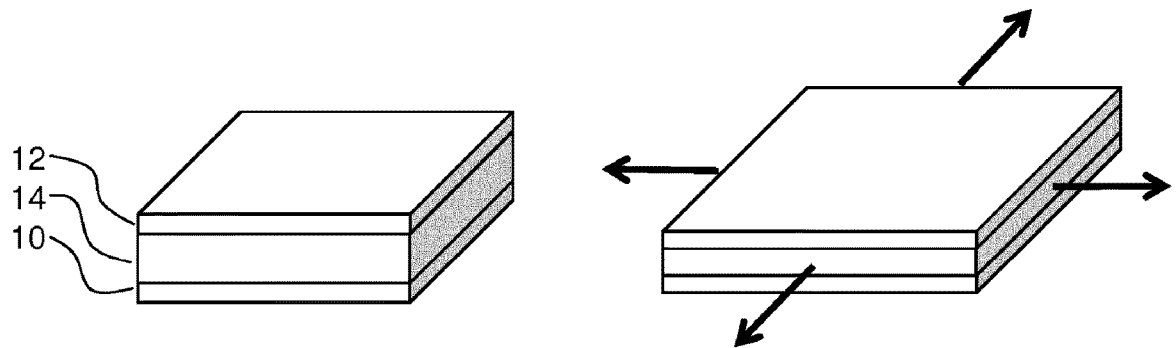
FIG. 1 shows a known EAP actuator, which is unconstrained and thus expands in plane.
Figure 2:
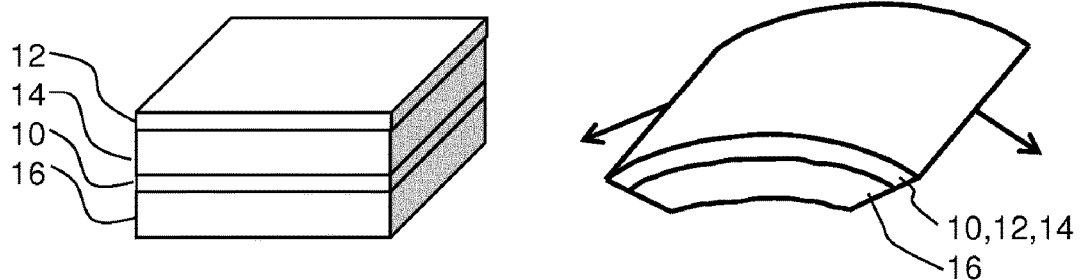
FIG. 2 shows a known EAP actuator, which is constrained and thus deforms output of plane.
Figure 3:
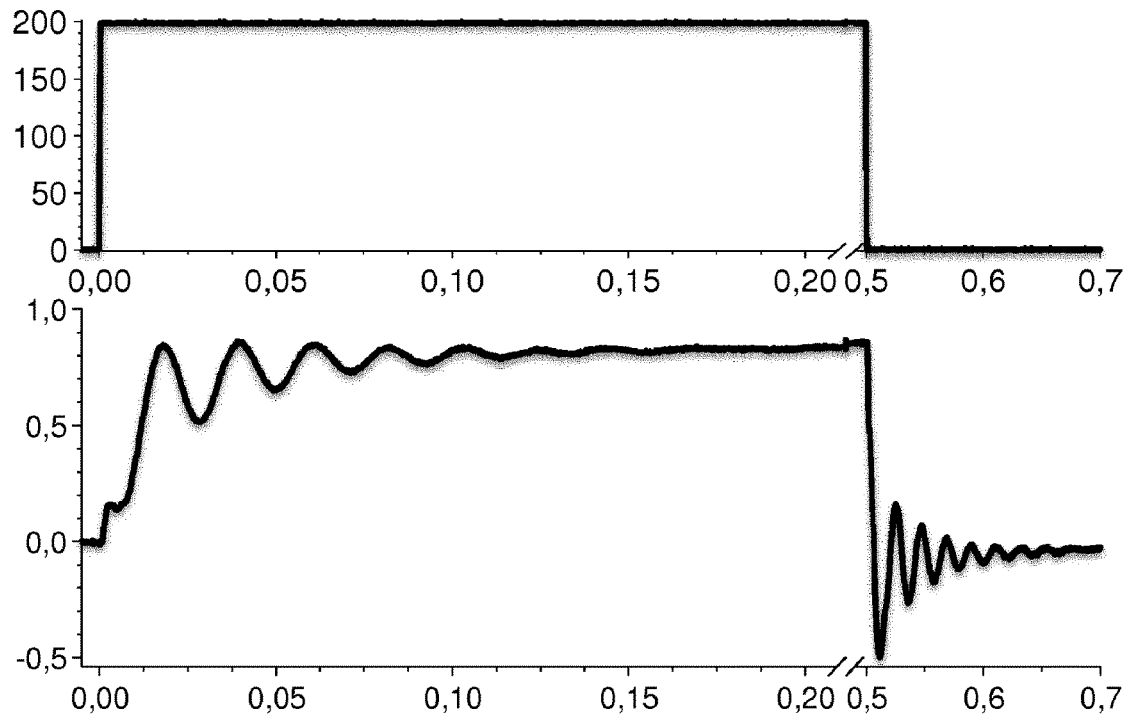
FIG. 3 shows the waveform of a conventional drive scheme and the response of an actuator to the drive waveform.

The invention provides a field driven electroactive polymer actuator which is actuated using an actuation drive having a profiled portion having a start voltage and an end voltage and a duration of at least 25 ms followed by a steady state drive portion based on a steady state voltage. The profiled portion comprises a voltage curve or a set of voltage points which define a first voltage slope at the beginning of the profiled portion which is steeper than a linear ramp between the start voltage and the end voltage, and a second voltage slope at the end of the profiled portion which is shallower than a linear ramp between the start voltage and the end voltage.

This means the voltage has a high initial gradient, and this reduced over time. The resulting curve gives a rapid actuation but with reduced oscillation.

Typically an EAP is controlled by a driving circuit which provides the required electrical voltage to operate the component. If the EAP is being activated, the driver normally generates a step dc voltage with a certain amplitude to bring the EAP into the desired position. Since electronic driving circuits are not ideal (e.g. they always have internal resistances), the actuation response is not only a function of the EAP itself but also of the driving circuit. In order to reduce the impact of the driver, the operating voltage for the EAP is usually stored in a capacitor, parallel to the EAP, and in terms of actuation this stored voltage is fed by an electronic switch (e.g. transistor, MOSFET) to the EAP.

The EAP actuator then starts to deform as a function of its charge, which again depends on the applied voltage amplitude. If the EAP is being deactivated, the applied voltage is being disconnected and accordingly the EAP will slowly discharge via its internal parallel resistance and finally will go back to its initial position.

A problem is that the step increase in voltage at the start of actuation in particular can give rise to mechanical oscillation. In particular, it has been observed by the applicant during experimental investigations that voltage (field) driven EAPs, operated by a rectangular voltage show strong oscillations during the activation phase, whereas a sinusoidal operation does not result in these oscillations. The oscillations during the activation phase are found to be caused by a sudden change of the control (activation) voltage. Mathematically this can be described as the slope or voltage derivative dv/dt.

If this slope exceeds a threshold, oscillations have been found to appear. If the slope is limited by providing a drive voltage which follows one of a set of suitable mathematical functions, these oscillations can be reduced, or even fully or almost fully eliminated. A further measure to assist in providing a non-oscillating activation of an EAP is a smooth transition between the activation phase and the final steady state. Again, a large step in operating voltage may cause oscillations. The change in the voltage amplitude at this transition should thus also be limited. For example, at the point of transition between activation phase and the final steady state position, the slope or voltage derivative dv/dt may be small or zero.

In order to determine the most suitable mathematical functions for the activation voltage, various measurements have been made using a standard voltage-driven EAP actuator.

The table below show the possible voltage actuation shapes.

TABLE 1

| Rectangular | $v_{rect}(t) := 0$ | $t < t_0$ | Equation 1 |
|---|---|---|---|
| | $v_{rect}(t) := v_{drive}$ | $t_0 \leq t \leq t_0 + t_{on}$ | |
| | $v_{rect}(t) := 0$ | $t > t_0 + t_{on}$ | |

TABLE 1-continued

| Ramp | $v_{rmp}(t) := v_{bias} + \dfrac{(v_{drive} - v_{bias})}{t_{smooth}} \cdot t$ | Equation 2 |
|---|---|---|
| Parabolic Parameters | $v_{para}(t) := a + b \cdot t - c \cdot t^2$ <br> $a := v_{bias}$ <br> $c := \dfrac{(v_{drive} - v_{bias})}{t_{smooth}^2}$ <br> $b := \dfrac{(v_{drive} - v_{bias}) + c \cdot t_{smooth}^2}{t_{smooth}}$ | Equation 3 |
| Exponential Parameters | $v_{exp}(t) := v_{bias} + (v_{drive} - v_{bias}) \cdot \left(1 - e^{\left(\frac{-t}{\tau}\right)}\right)$ <br> $\tau := \dfrac{t_{smooth}}{nrc}$ | Equation 4 |
| Root Parameters | $v_{root}(t) := a + b \cdot \sqrt[m]{t}$ <br> $a := v_{bias}$ <br> $b := \dfrac{(v_{drive} - v_{bias})}{\sqrt[m]{t_{smooth}}}$ | Equation 5 |

The driving schemes form a curved voltage-time profile which will be named a "profiled portion" of the drive waveform, which is followed by the steady state part of the waveform which is intended to hold the actuator in the actuated state.

For all driving schemes used for the experiments, the maximum driving voltage amplitude ($v_{drive}$) was limited to 200V. Furthermore, the frequency of operation was set to 1 Hz with a duty cycle of 50%. All functions are defined to allow for a d-bias ($v_{bias}$) at the beginning ($t_0$), in the form of a step increase from 0V driving voltage to the d-bias voltage at time $t_0$. The start of the profiled portion may thus be defined as starting after such a dc bias. The profiled portion is limited in time ($t_{smooth}$), so that $t_{smooth}$ is the time at the end of the profiled portion. As reference, an EAP, driven by a rectangular activation pulse as described by Equation 1, is used. With reference to the maximum driving voltage of 200V, this dc-bias was set to 0, 25% (=50V), 50% (=100V) and 75% (=150V).

For each of these settings the smoothing time (during which the profiled portion i.e. smoothing function is applied) was adjusted to 1ns, 25 ms, 50 ms, 75 ms and 100 ms.

This smoothing time has an influence on the slope of the smoothing functions as can be seen in the corresponding equations of Table 1, so that the voltage waveform reaches the 200V steady state value at time $t_{smooth}$.

Apart from the functions defined above, other functions fulfill the requirement of a moderate slope at the start and a (almost) zero slope at the transition point to the steady state operation (at $t_{smooth}$). Other functions include the inverse tangent (a tan) functions, sinusoidal-functions (quarter wavelength, 0 to π/2) and logarithmic functions.

Figure 4:
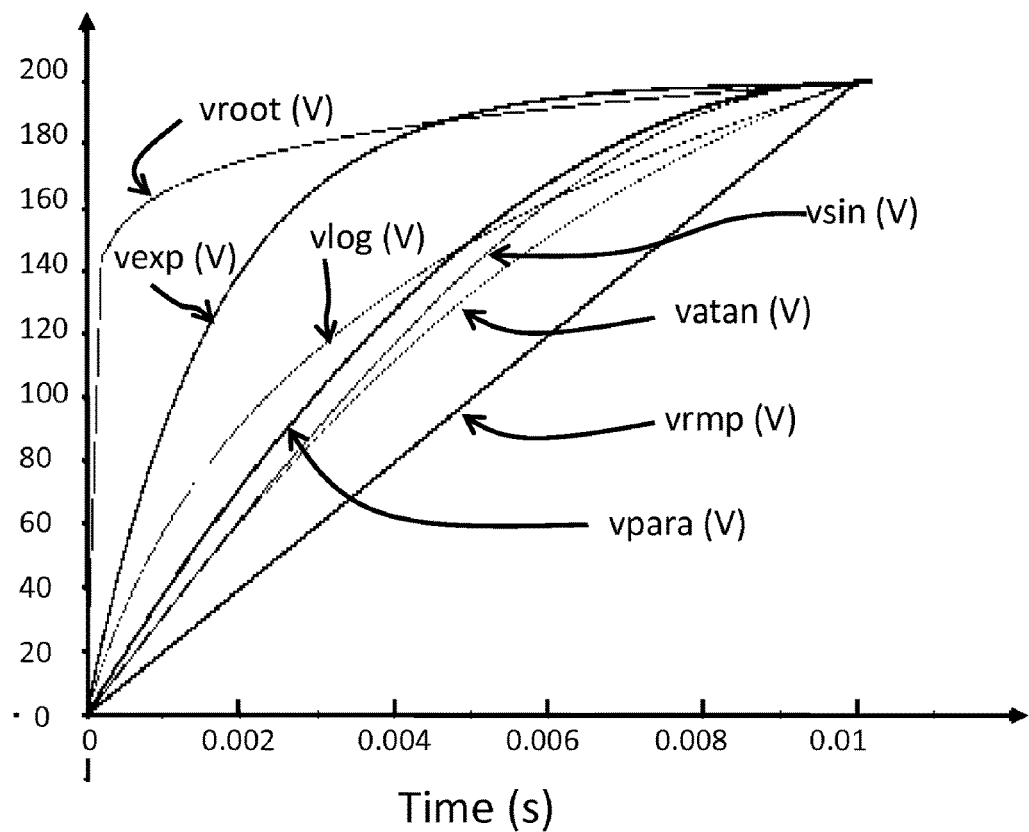
FIG. 4 shows a variety of different functions which be used to form a modified drive waveform.

FIG. 4 shows seven example functions plotted from time 0 to 0.01 1s, where $t_{smooth}$=0.01 s. The functions are shown with no d-bias.

The functions are a ramp function vrmp, a parabolic function vpara, an a tan function vatan, a sinusoidal function vsin, a root function vroot, a log function vlog and an exponential function vexp.

Figure 5:
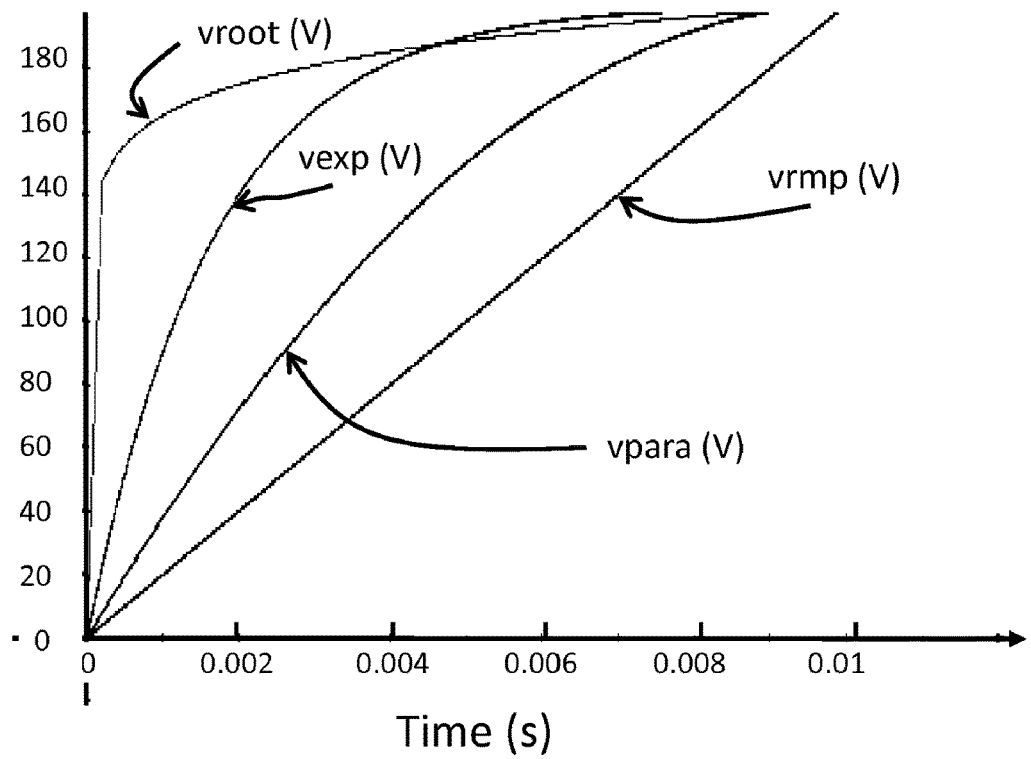
FIG. 5 shows the functions of FIG. 4 with one group replaced by a single representative function for the purposes of further evaluation.

As can be seen, some of these functions (log, sinusoidal, a tan and the parabolic function) have a quite similar shape. Therefore, only four functions are selected for further evaluation as shown in FIG. 5, with the parabolic function representing the similar group. Parameters for the parabolic function are chosen giving a gentle slope at the beginning not greatly steeper than the straight ramp function. An advantage of the parabolic function is that it gives a zero slope at the transition to the steady state operation. An exemplarily function representing a medium slope at the beginning is the exponential function (i.e. with nrc=6), whereas the twelfth root function (i.e. with m=12) represents the class of functions with a steep slope at the beginning.

Of course, all functions have parameters (nrc or m) which may be selected and which influence the shape/slope of the function itself.

FIGS. 6 to 21 show measurement results. Each of these graphs shows the driving voltage (as voltage versus time) on top and the corresponding mechanical deflection of the EAP at the bottom (as deflection versus time). The different plots within each individual figure represent a variation in the smoothing time ($t_{smooth}$), which was 10 ms, 25 ms, 50 ms, 75 ms and finally 100 ms. As reference, a rectangular driving shape with the correlated large oscillations is also shown in each case. This may be considered to be a plot for $t_{smooth}$=0.

In each case, the mechanical response curves show the greatest and most quickly arriving oscillations for the shortest time period $t_{smooth}$. For this reason, the plots are labeled only in FIG. 6. It will be immediately apparent how the plots in the other figures correspond.

Figure 6:
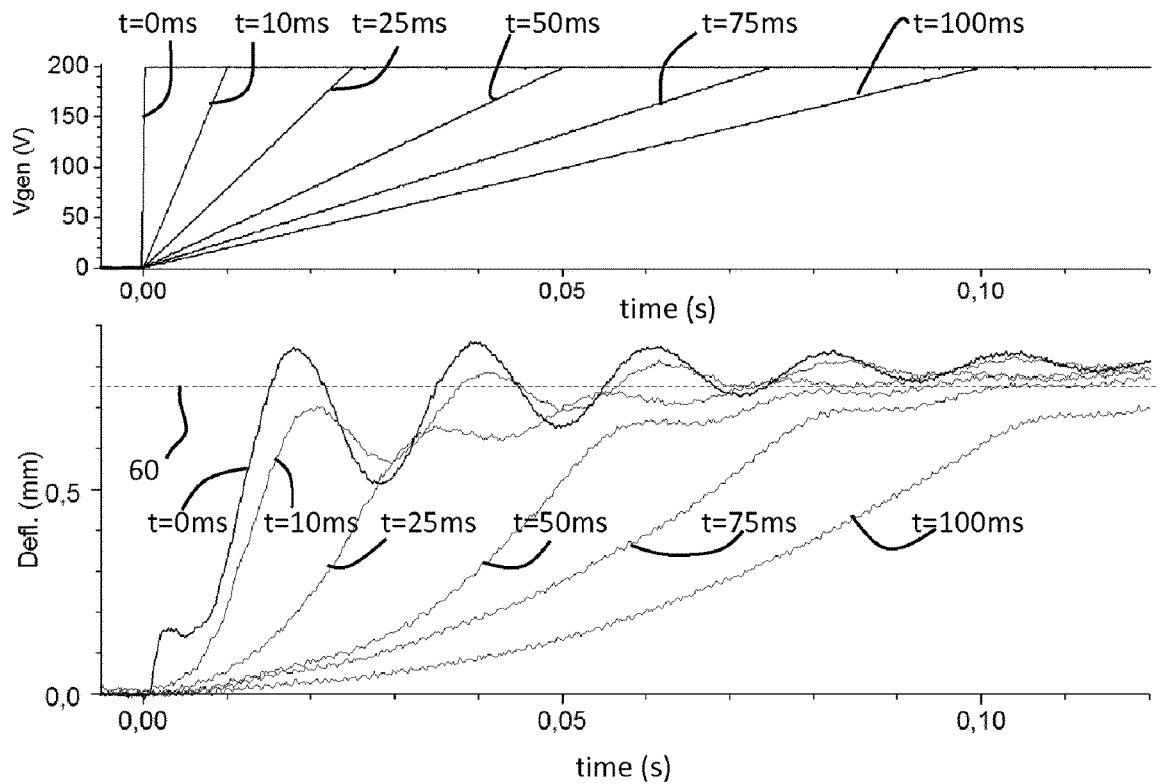
FIGS. 6 to 9 show the effect of a varied initial bias voltage when applying a ramp function as the drive waveform.
Figure 7:
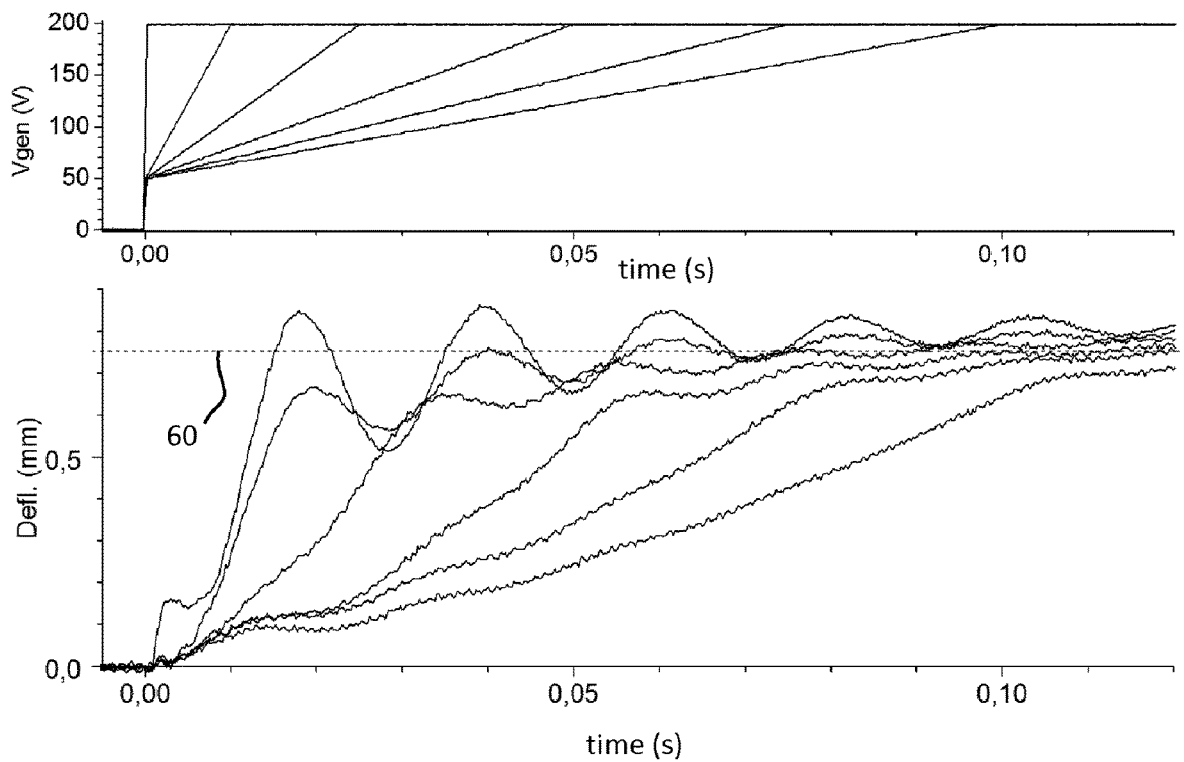
Figure 8:
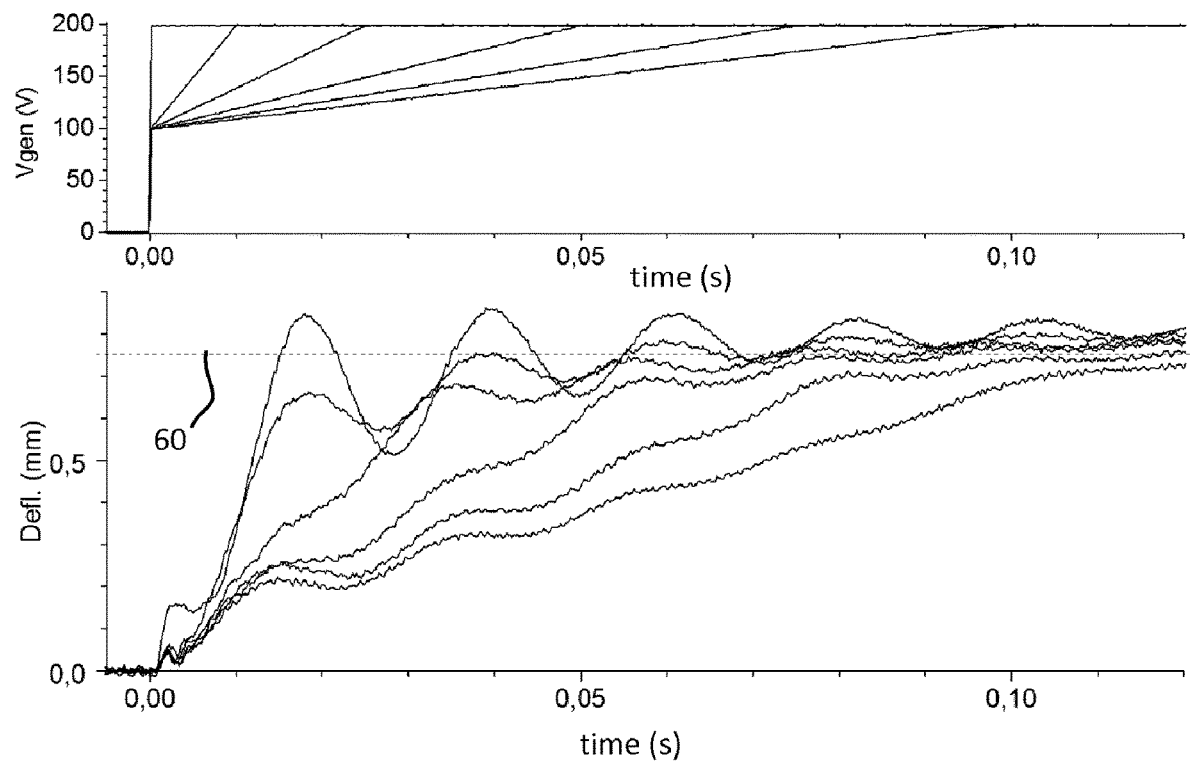
Figure 9:
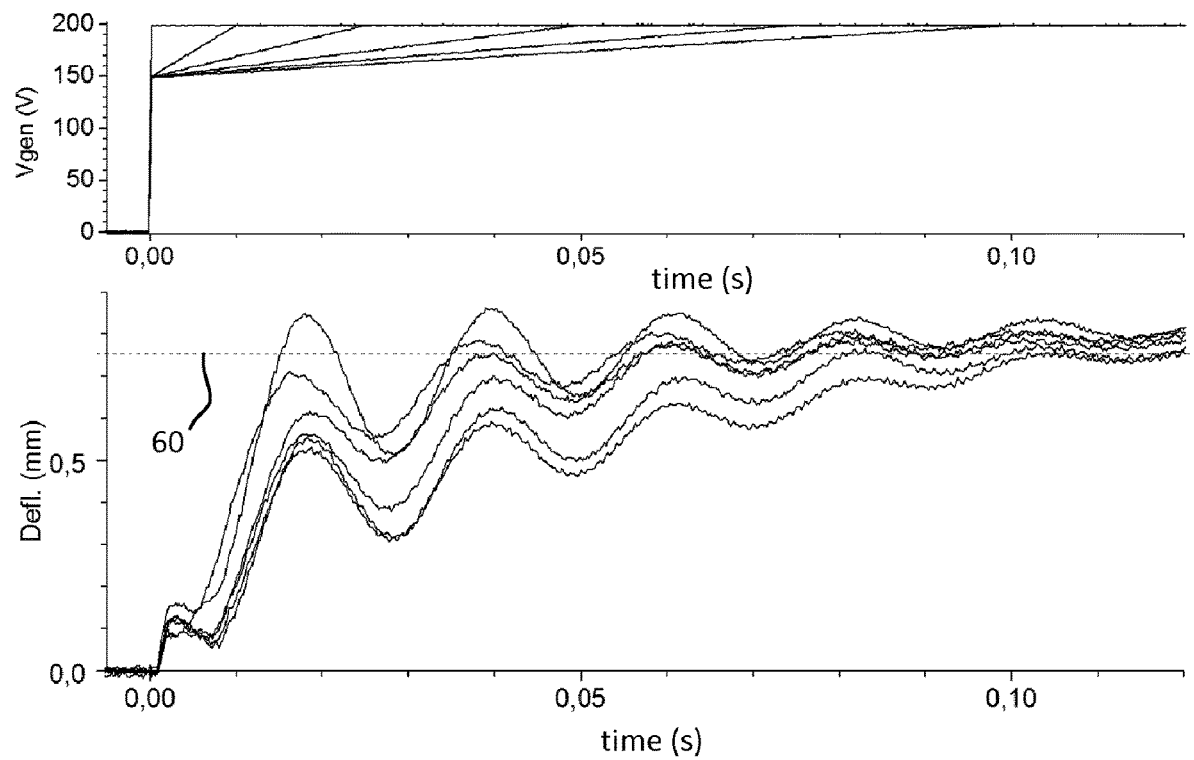

A first set of measurements is shown in the graphs of FIGS. 6 to 9 for a ramp voltage. FIG. 6 is for no initial step voltage before the "profiled portion" (i.e. the ramp). FIG. 7 is for a 25% initial step voltage before the "profiled portion". FIG. 8 is for a 50% initial step voltage before the "profiled portion". FIG. 9 is for a 75% initial step voltage before the "profiled portion".

Since a fast activation without notable oscillations would be of benefit, in the deflection graphs a 90% threshold line 60 is added. This threshold line 60 indicates a mechanical deflection of 90% of the maximum deflection and can be used to identify the speed of the activation itself. If this threshold is taken into account for the rectangular driven EAP, the time for such an oscillating EAP to reach its stable state is about 75 ms. However during this time the EAP would already have passed the threshold 4 times corresponding to a change from the off-state to the on-state four times.

Some clear trends can be observed. Firstly, short smoothing times of 25 ms and below still have significant oscillation. Secondly, a small d-bias (offset) of about 25% (of the maximum driving amplitude) at the beginning does not cause larger oscillations as seen in FIG. 7, whereas larger d-bias increases the oscillations as seen in FIG. 9. Thirdly, a fast activation with (almost) no oscillations seem contradictory aims when using a ramp waveform, since the 90% deflection target is not reached within a reasonable time. Ideally the steady state position would be reached within a time which is close to the normal activation time, if the EAP is driven by a rectangular pulse.

Figure 10:
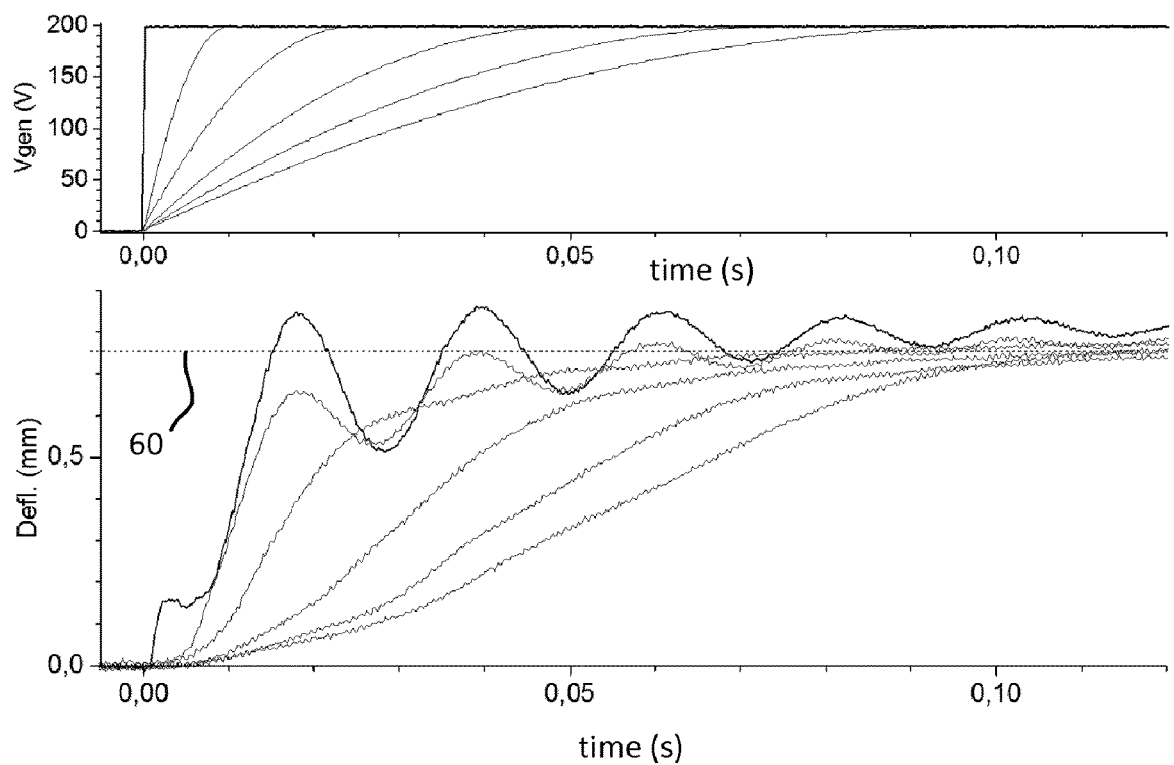
FIGS. 10 to 13 show the effect of a varied initial bias voltage when applying a parabolic function as the drive waveform.
Figure 11:
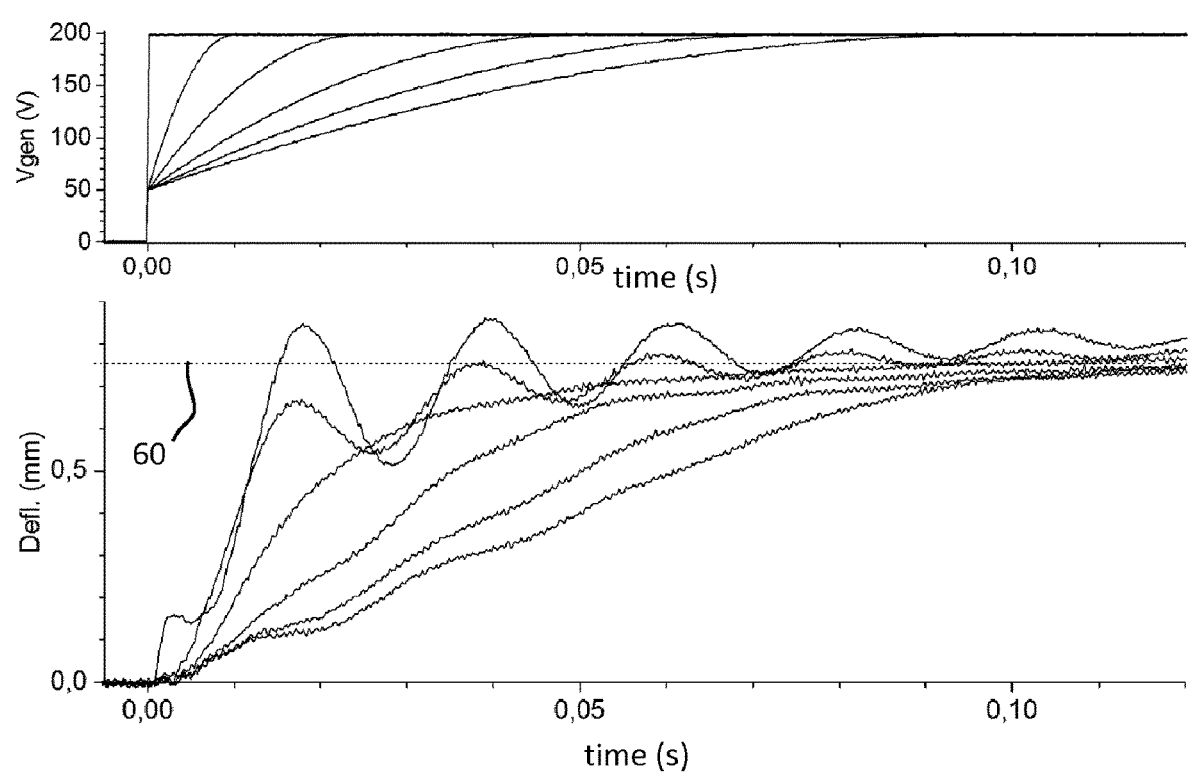
Figure 12:
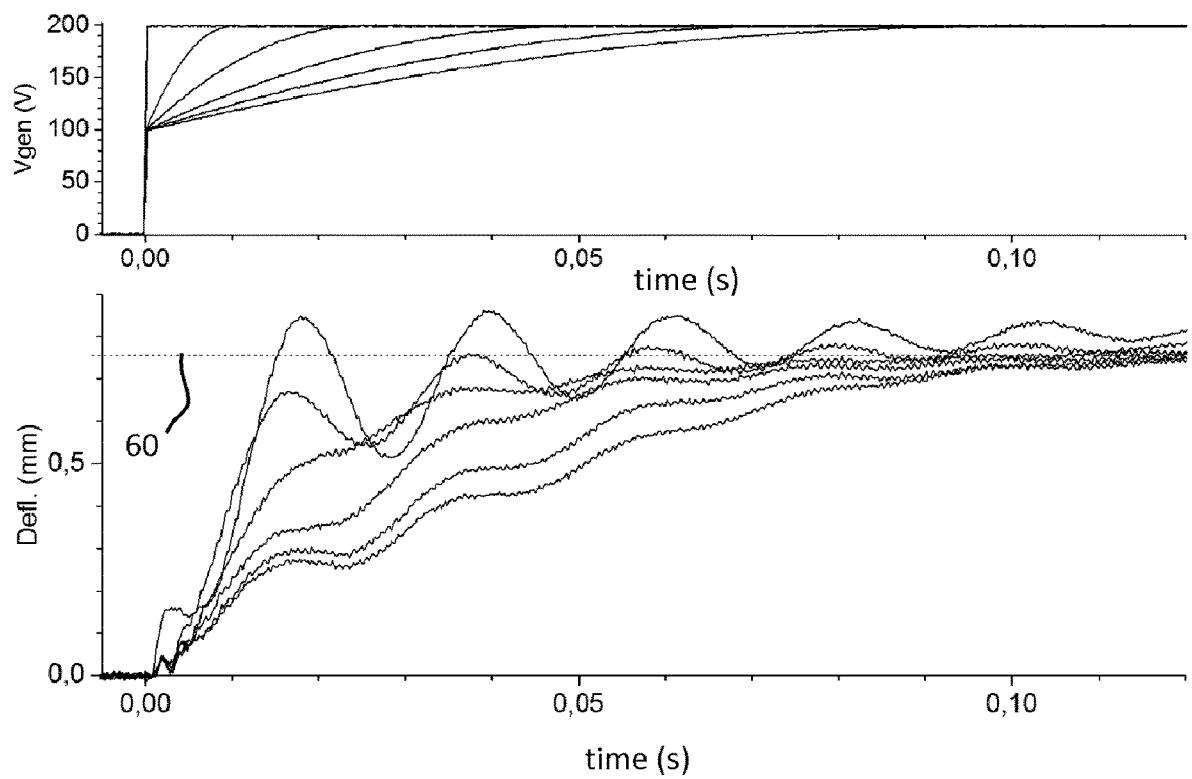
Figure 13:
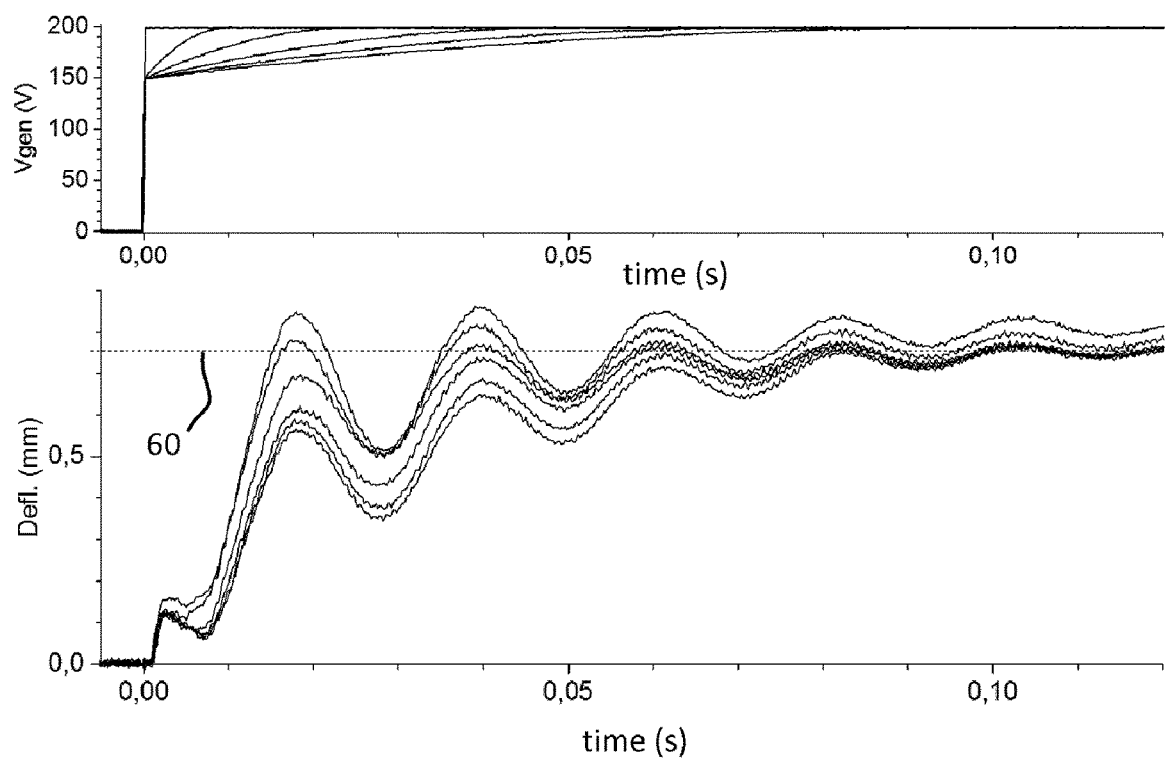

The performance of the EAP when operated by a parabolic function is shown in FIGS. 10 to 13. FIG. 10 is for no initial step voltage before the "profiled portion". FIG. 11 is for a 25% initial step voltage before the "profiled portion". FIG. 12 is for a 50% initial step voltage before the "profiled portion". FIG. 13 is for a 75% initial step voltage before the "profiled portion".

A clear improvement to the performance of a rectangular driven as well as the ramp driven EAP can be observed. The oscillations can be completely damped, even at reasonable activation times around 100 ms. Smoothing times between 25 ms and 100 ms all show a good performance, whereas a too short smoothing time of 10 ms still results in oscillations. A dc-bias at the beginning is implementable as well. However a too high d-bias of 75% again shows strong oscillations. By way of example, a d-bias of 50% (i.e. FIG. 12) at smoothing times between 25 ms and 100 ms is for example acceptable for some applications. This excludes the two most oscillating traces in FIG. 12 (for 0 ms and 10 ms).

Figure 14:
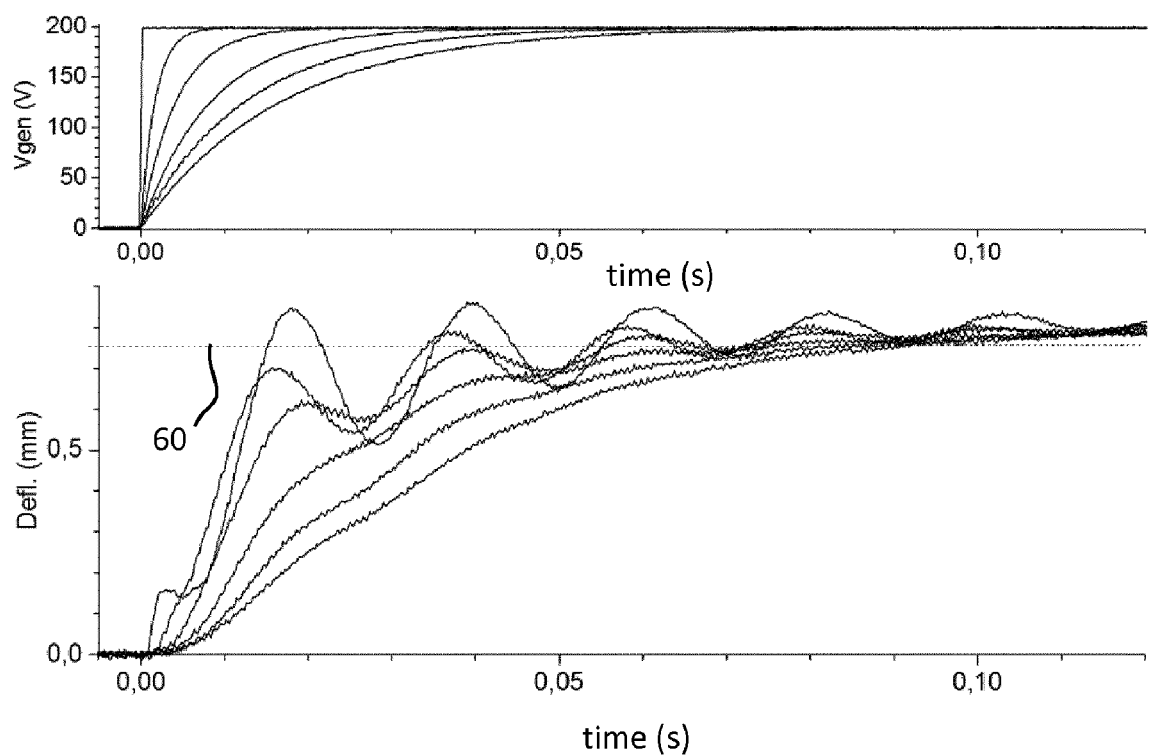
FIGS. 14 to 17 show the effect of a varied initial bias voltage when applying an exponential function as the drive waveform.
Figure 15:
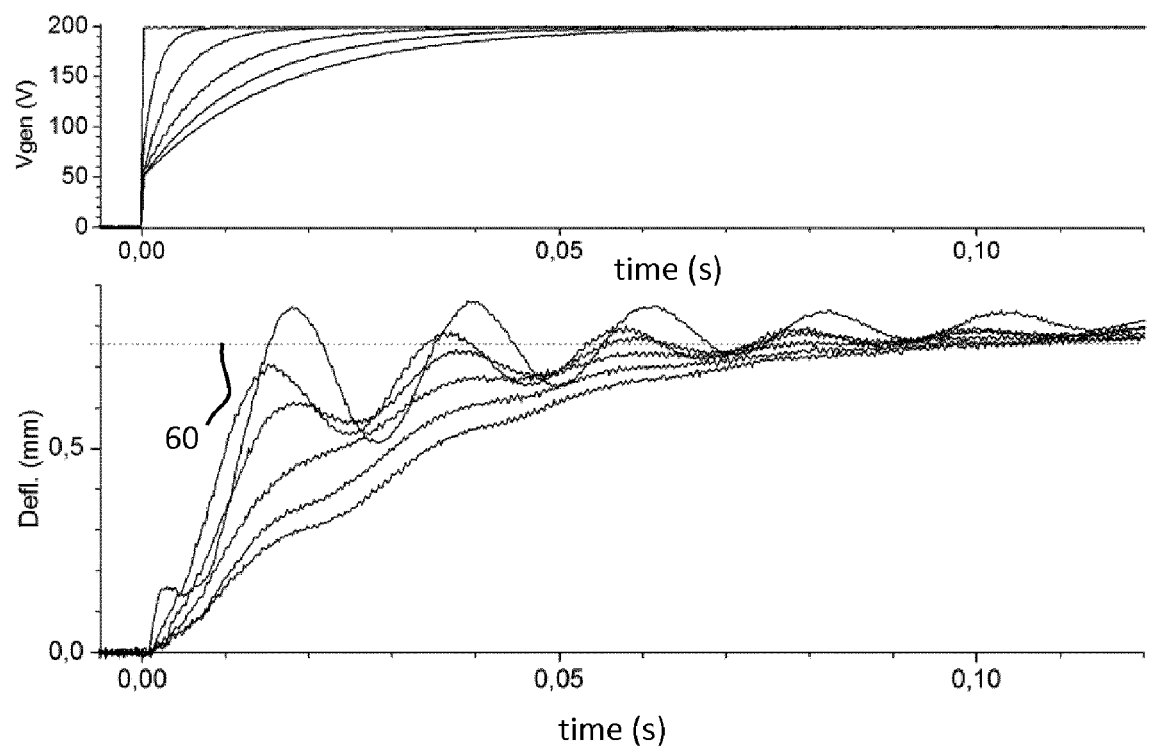
Figure 16:
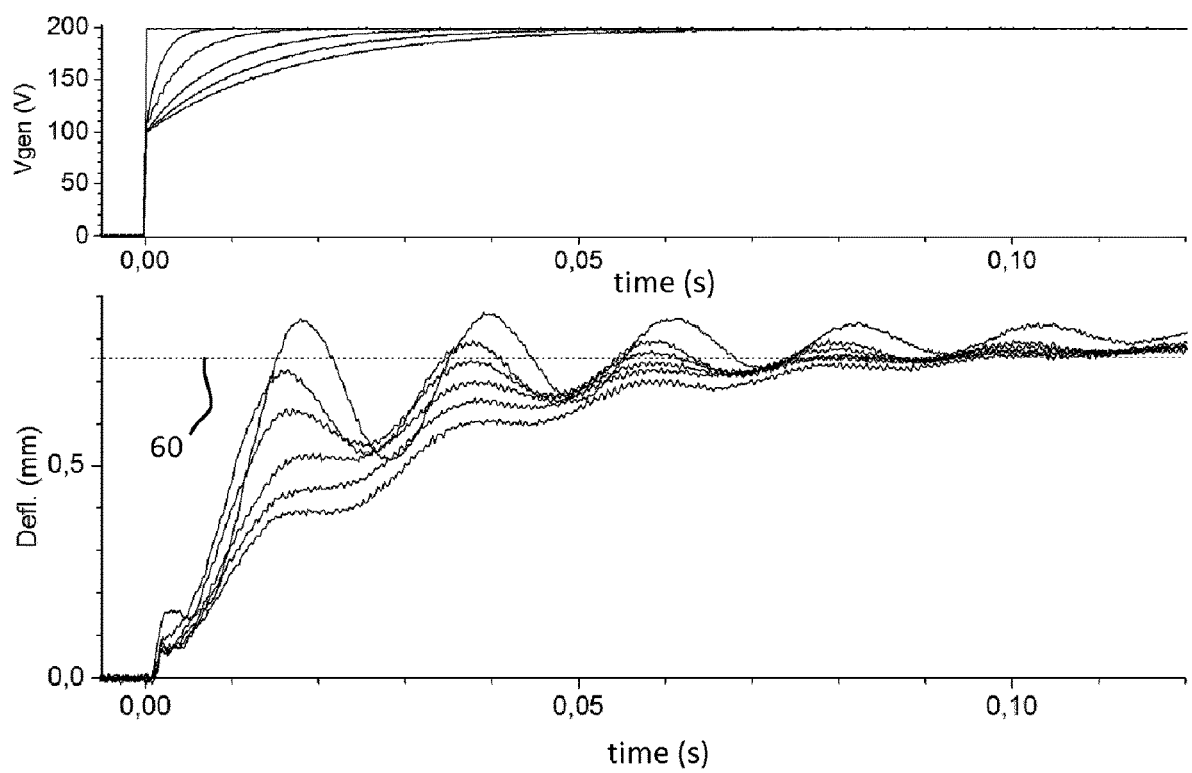
Figure 17:
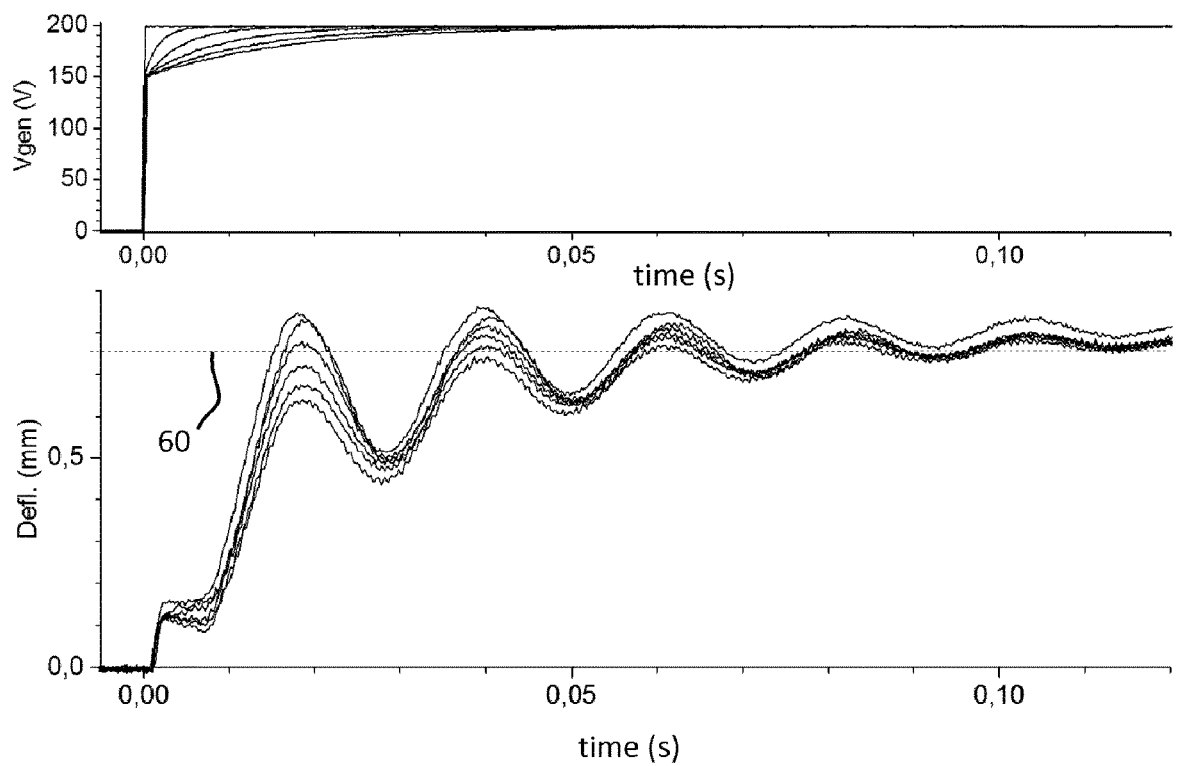

The performance of the EAP when operated by an exponential function (with nrc=6) is shown in FIGS. 14 to 17. FIG. 14 is for no initial step voltage before the "profiled portion". FIG. 15 is for a 25% initial step voltage before the "profiled portion". FIG. 16 is for a 50% initial step voltage before the "profiled portion". FIG. 17 is for a 75% initial step voltage before the "profiled portion".

The exponentially driven EAP actuator also shows a clear improvement compared to the rectangular and ramp driven EAPs. In comparison to the parabolic driven EAP of FIGS. 10 to 13, the exponentially driven EAP has a bigger slope at the beginning. Accordingly, the performance for a smoothing time of 25 ms shows slightly larger oscillations. However, the response is basically similar to the parabolic driven EAP, or marginally better in that oscillations are as damped as observed for the parabolic driven EAP, but the activation is a slightly faster. Specifically, an overall activation time of 75 ms (the same as for the rectangular driven EAP) can be seen for a smoothing time of 50 ms for both 0V d-bias (i.e. FIG. 14) as well as 25% d-bias (i.e. FIG. 15).

Figure 18:
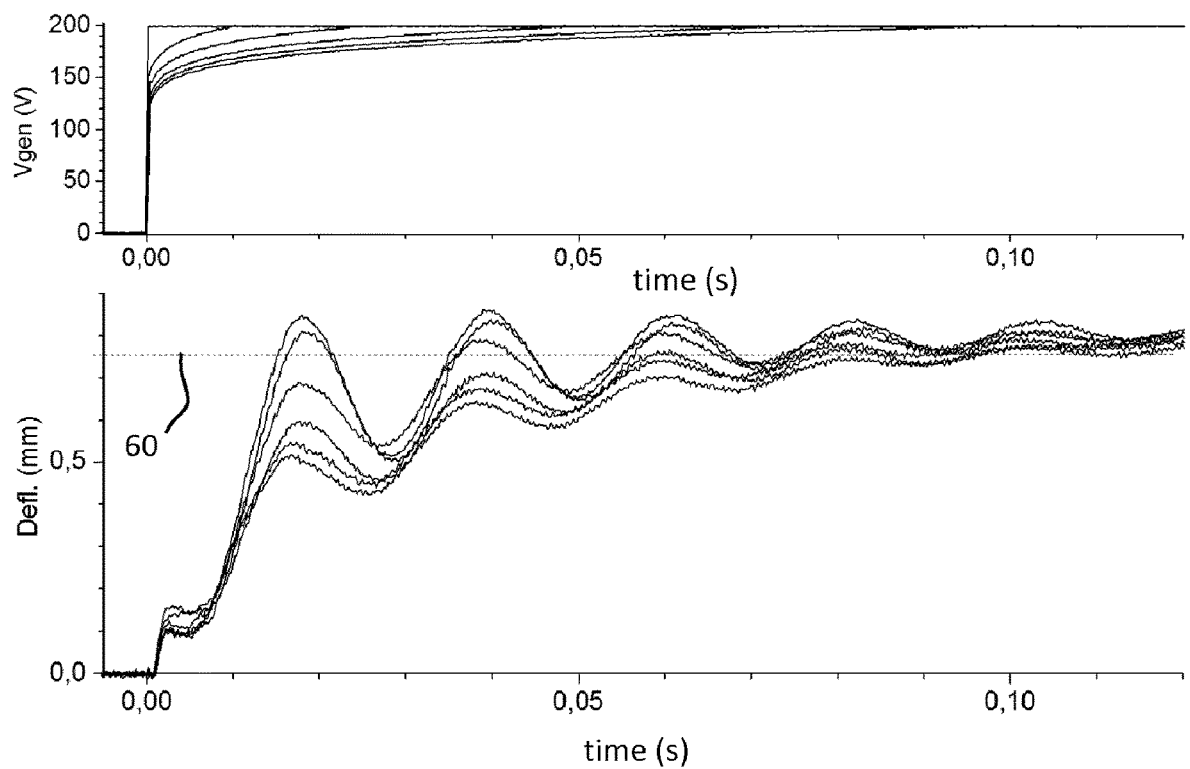
FIGS. 18 to 21 show the effect of a varied initial bias voltage when applying a root function as the drive waveform.
Figure 19:
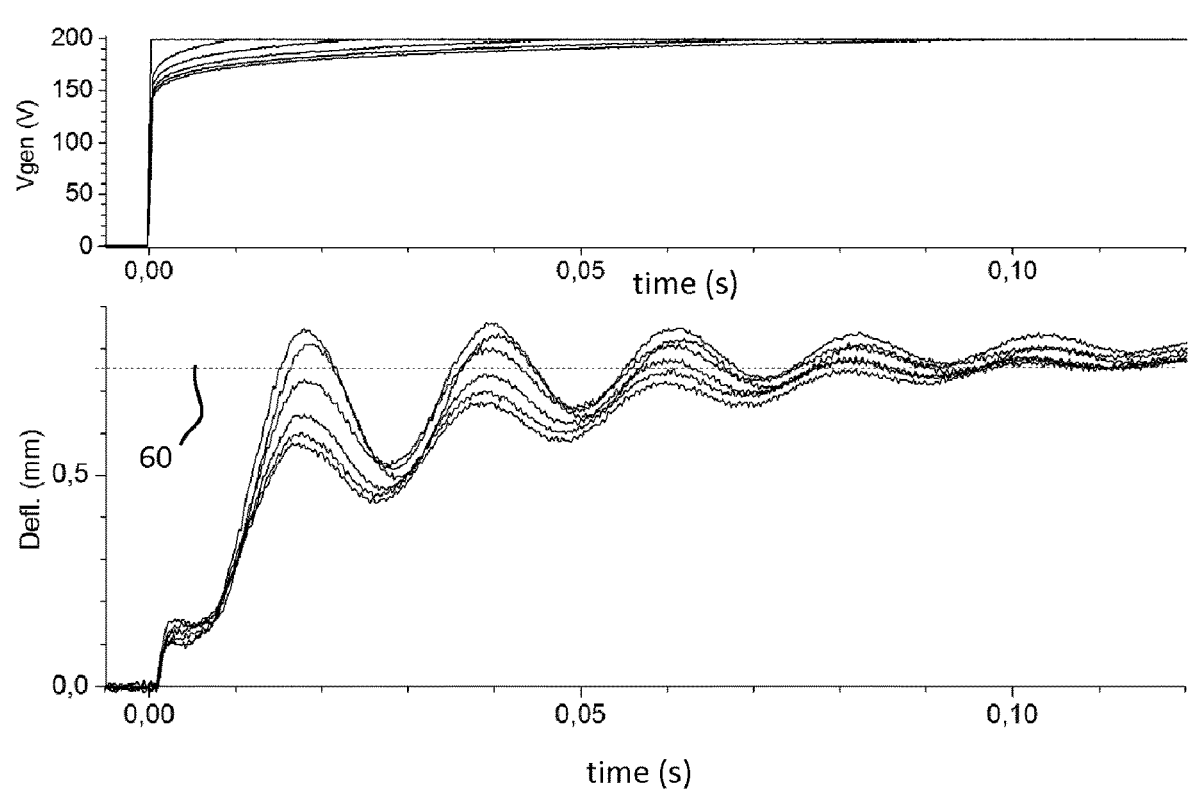
Figure 20:
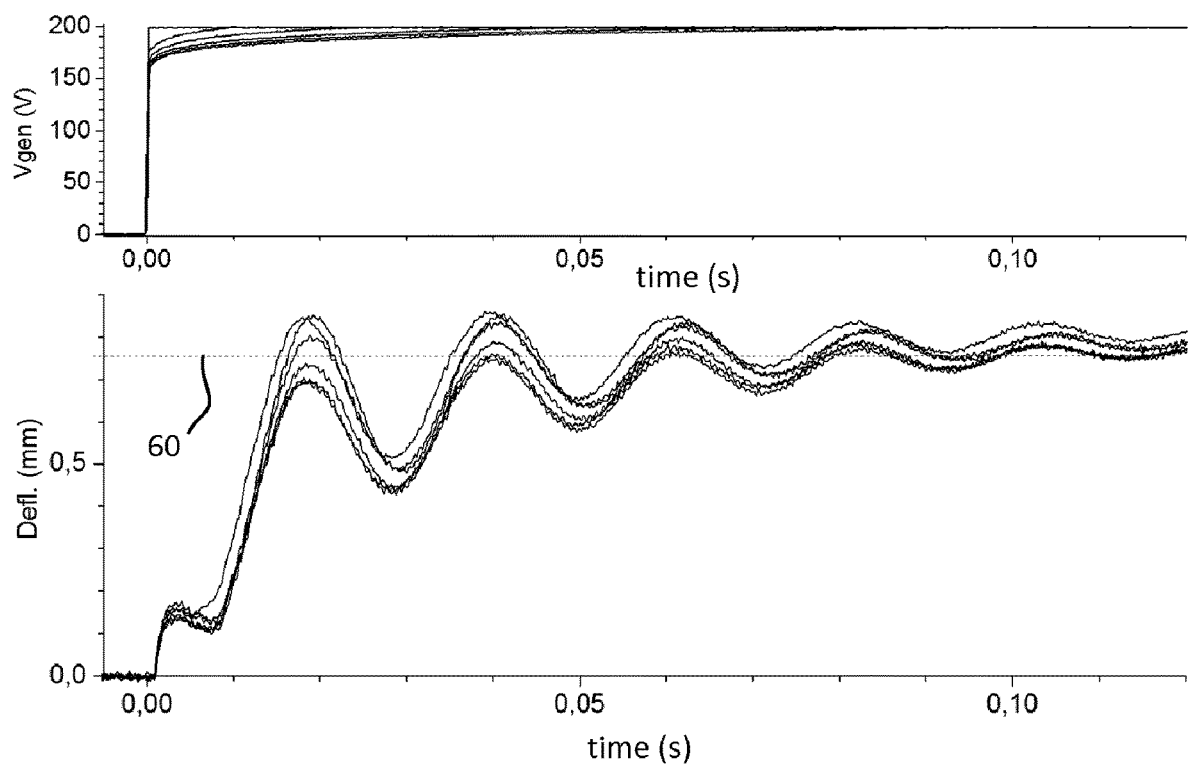
Figure 21:
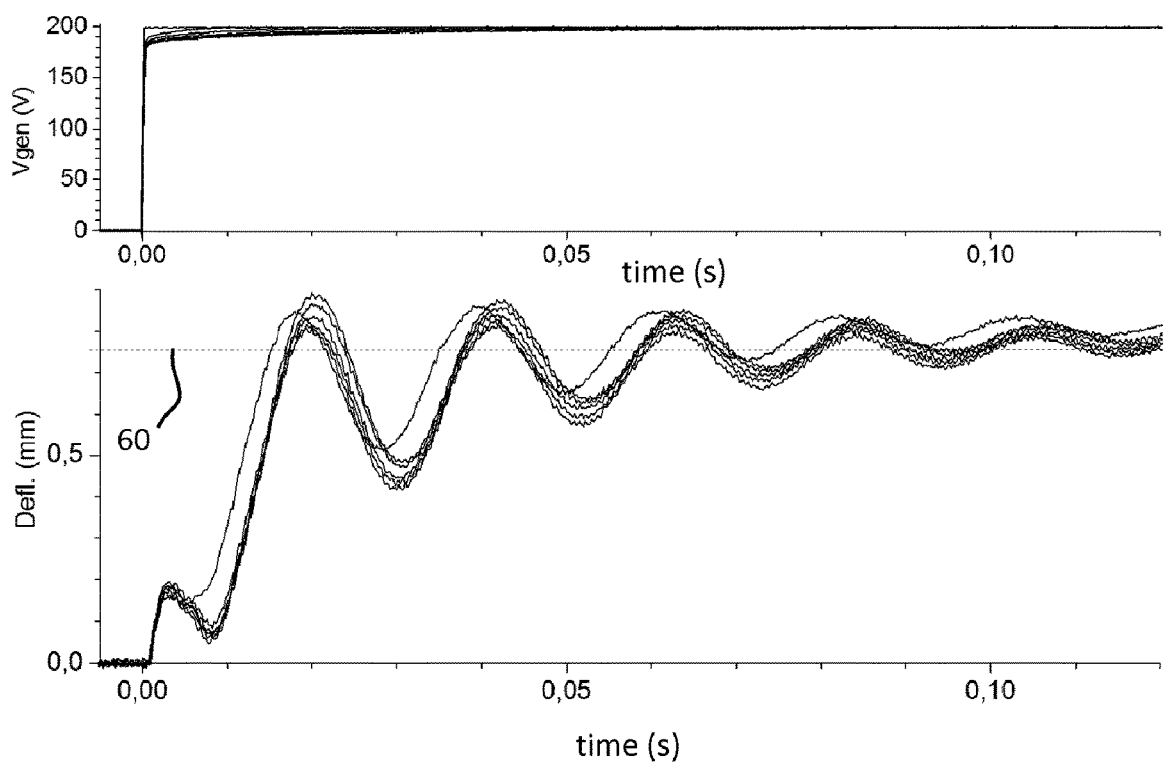

The performance of the EAP when operated by a root function (with m=12) is shown in FIGS. 18 to 21. FIG. 18 is for no initial step voltage before the "profiled portion". FIG. 19 is for a 25% initial step voltage before the "profiled portion". FIG. 20 is for a 50% initial step voltage before the "profiled portion". FIG. 21 is for a 75% initial step voltage before the "profiled portion".

A high order root (m=12) is intentionally chosen in order to generate a very steep slope at the beginning of the activation phase. According to this large slope at the beginning the oscillations hardly are damped. Even for a long smoothing time and no d-bias still only slightly damped oscillations are recognizable.

Thus, best performance in terms of reduced oscillations while activating the EAP as quickly as possible is observed, when the device has been operated by a parabolic- and/or an exponential function.

Figure 22:
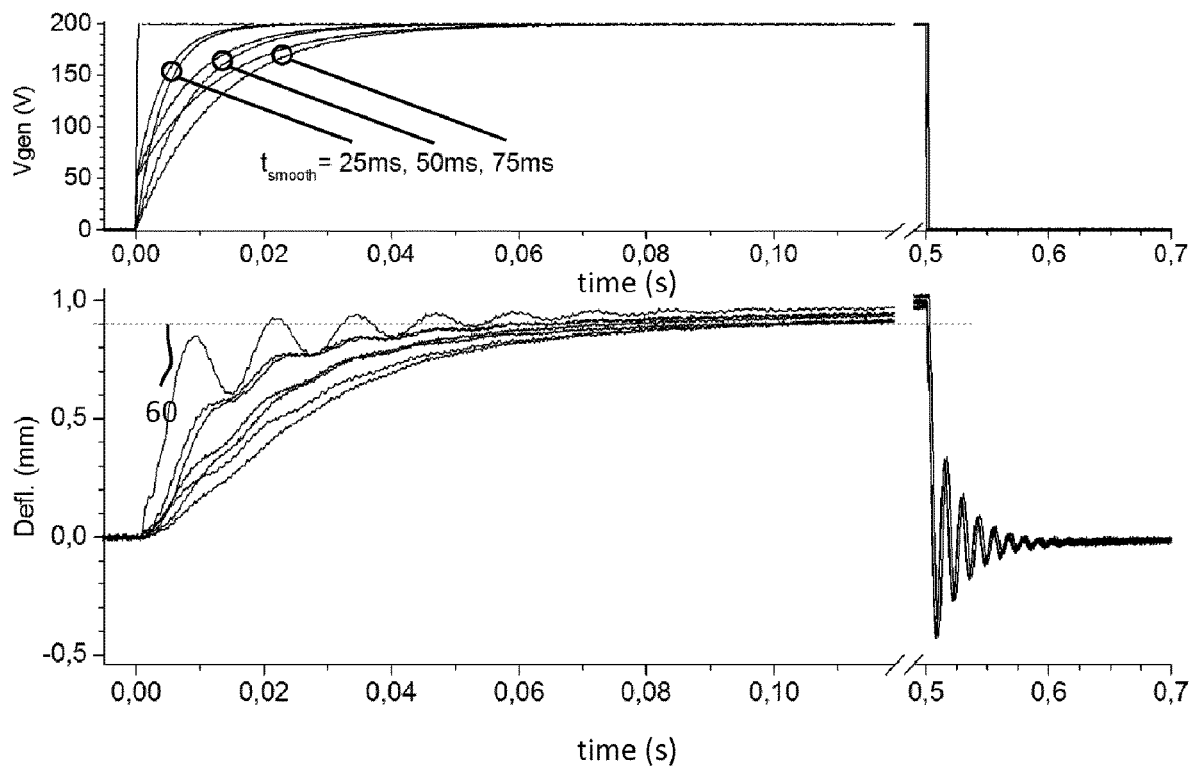
FIGS. 22 to 25 show the effect of a varied exponent when applying an exponential function as the drive waveform for two different initial bias values.

Since the exponential function is more flexible in choosing the exponent (corresponding to the slope of this function) the performance of an EAP when operated by an exponential function with different slopes (by variation of parameter nrc) is shown in FIG. 22.

In FIG. 22, there is a set of plots for $t_{smooth}$=25 ms, for $t_{smooth}$=50 ms and for $t_{smooth}$=75 ms. For each value, there are two plots, one for 0% d bias offset and one for 25% dc bias offset.

Figure 23:
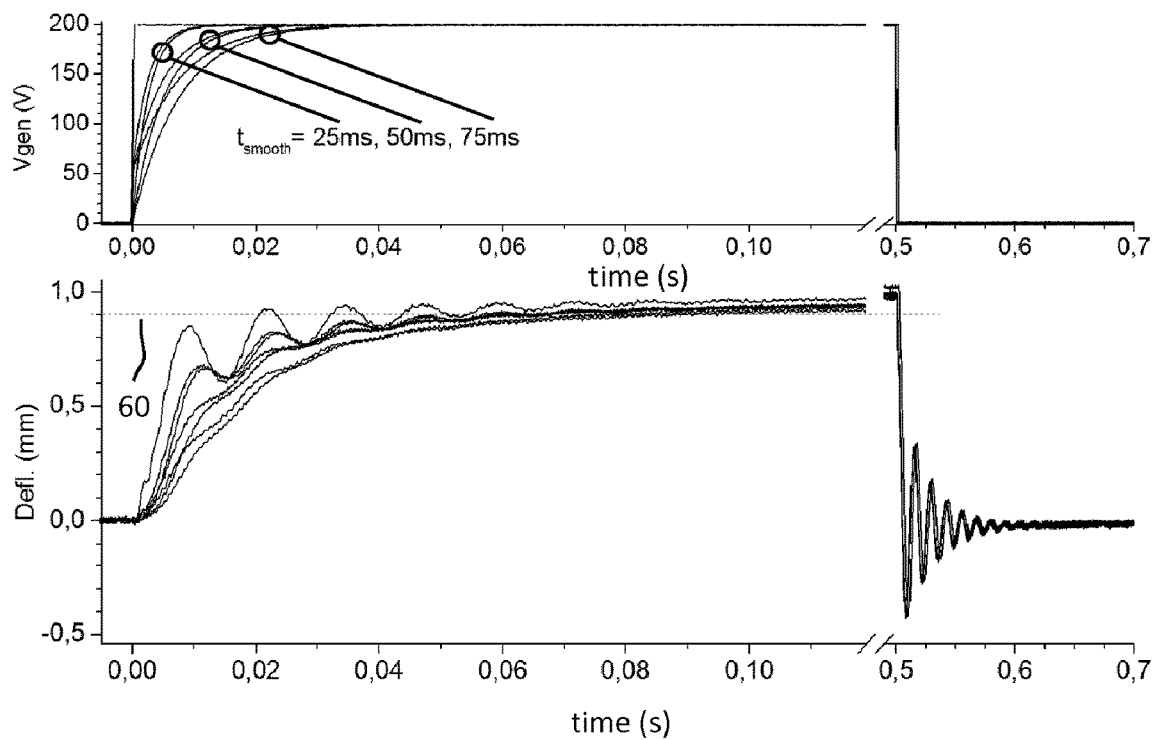
Figure 24:
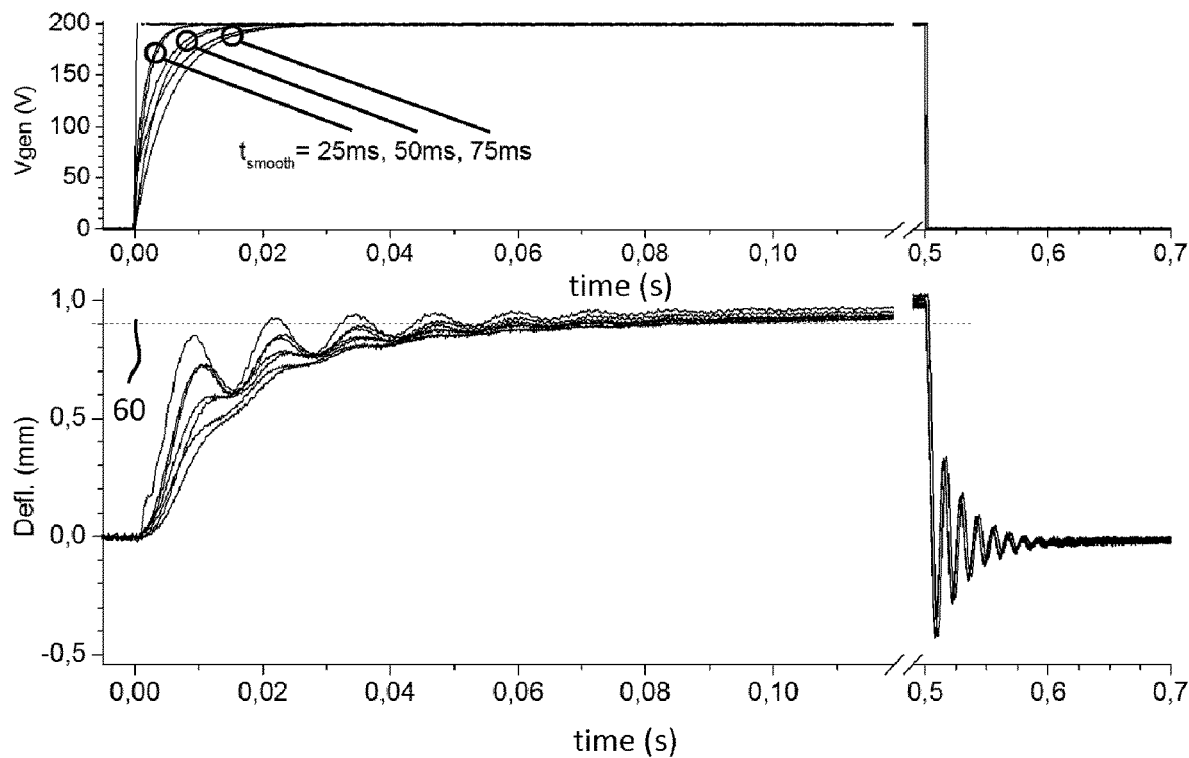
Figure 25:
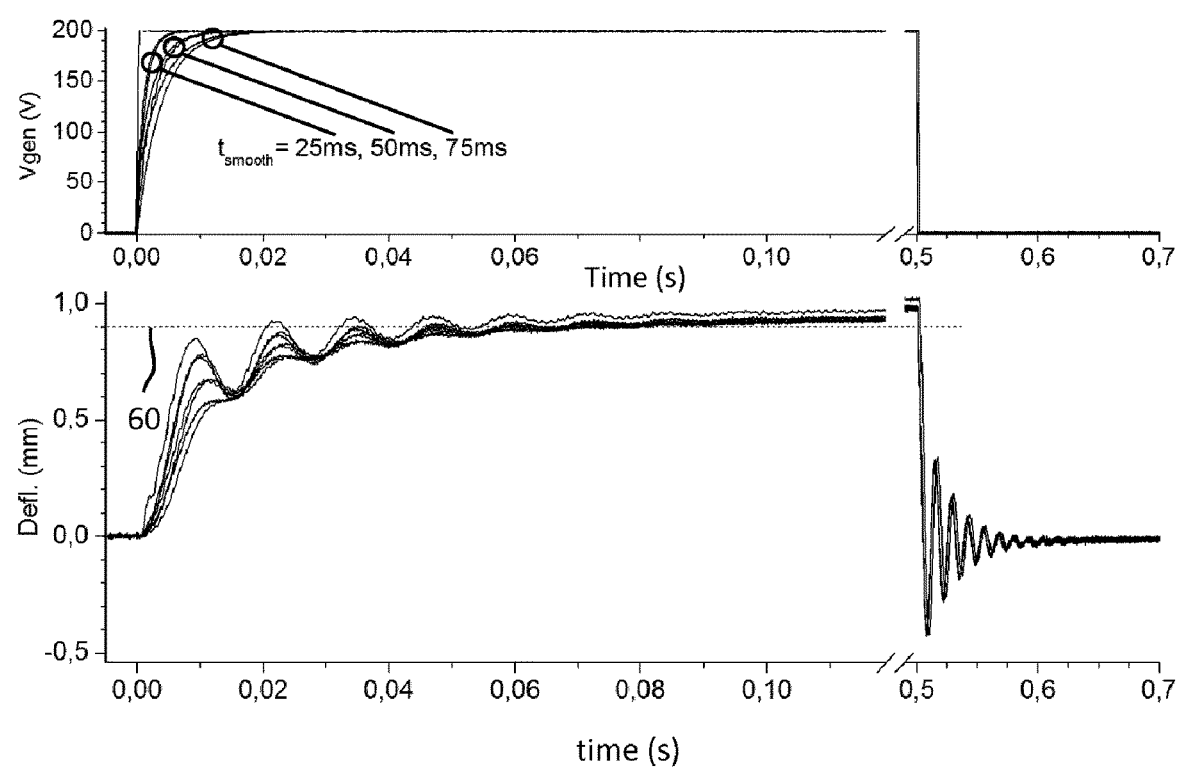

FIG. 22 is for nrc=6, FIG. 23 is for nrc=10, FIG. 24 is for nrc=14 and FIG. 25 is for nrc=20.

The parameter nrc defines the exponential time constant in relation to the total smoothing time. A larger value of nrc leads to a steeper slope whereas a smaller value of nrc results in a flat response.

From this parameter variation, the best-suited exponent (i.e. the corresponding value of nrc) can be identified. The largest value of nrc=20 (FIG. 25) results in a fast activation while still having small oscillations. Similar but not as fast responses of about 70 ms have been observed for nrc=6 (with a smoothing time $t_{smooth}$=25 ms) and nrc=14 (with a smoothing time $t_{smooth}$=50 ms).

Slightly faster activation was reached with an exponential parameter of nrc=10 ($t_{smooth}$=25 ms and 50 ms), For all these settings, a dc bias of 0 or 25% seems to be feasible.

The invention provides an approach by which the EAP actuator is actuated fast as possible while minimizing mechanical oscillations. At the beginning of the profiled portion of the activation waveform, the voltage derivative dv/dt (slope) is higher than that of an ordinary ramp but smaller than 'infinite' (i.e. an ideal rectangular pulse). At the end of the activation time ($t_{smooth}$) the voltage derivative is as small as possible in order to provide a smooth transition to the steady state driving with an ordinary constant or pulsed dc-voltage (or ac voltage).

Figure 26:
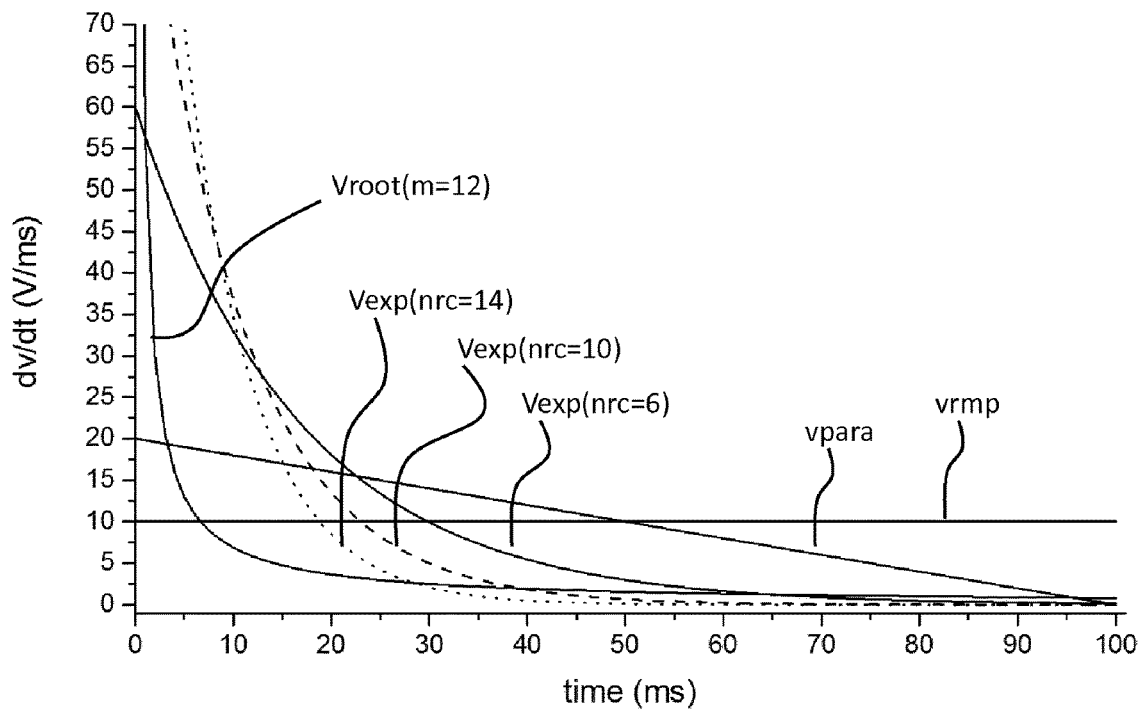
FIG. 26 shows normalized voltage derivatives for some of the functions used above.

The normalized voltage derivatives of the smoothing functions discussed above are shown in FIG. 26 for $t_{smooth}$=100 ms, and labeled using same notation as in FIG. 5 (note that the y-axis values are normalized and therefore arbitrary). In comparison to the constant slope of a ramp-function vrmp better suited smoothing functions such as the parabolic function vpara and exponential function vexp give larger slope during the start of the activation and smaller slopes during the transition to the steady state operation mode (at t>100 ms). The higher order root vroot is less satisfactory.

The parabolic function has a constant slope, whereas the time-dependent behavior of an exponential or root function can be adapted by their parameters as defined in Table 1 above. These parameters may be fine-tuned according to the requirements of the envisaged application, especially the activation (smoothing) time, maximum driving amplitude and tolerable oscillation amplitudes, but also adapted to the EAP actuator itself.

Accordingly, the numbers presented above are purely by way of example. In addition, lower order root functions with a small root exponent (e.g. m=3 or 4) also have much smaller voltage derivatives, and they may also be used, and their performance can be optimized.

Instead of using only one smoothing function, the overall profiled portion may be implemented by means of a combination of several smoothing functions (also including step and ramp function portions). For example, within a certain time frame $\Delta t_m$ of the whole smoothing time, smoothing function 1 may be used. For another sub-frame $\Delta t_{m+1}$ function 2 may be used and even within another time frame $\Delta t_{m+n}$ maybe again function 1 (with a different or the same parameter setting) may be used.

Figure 27:
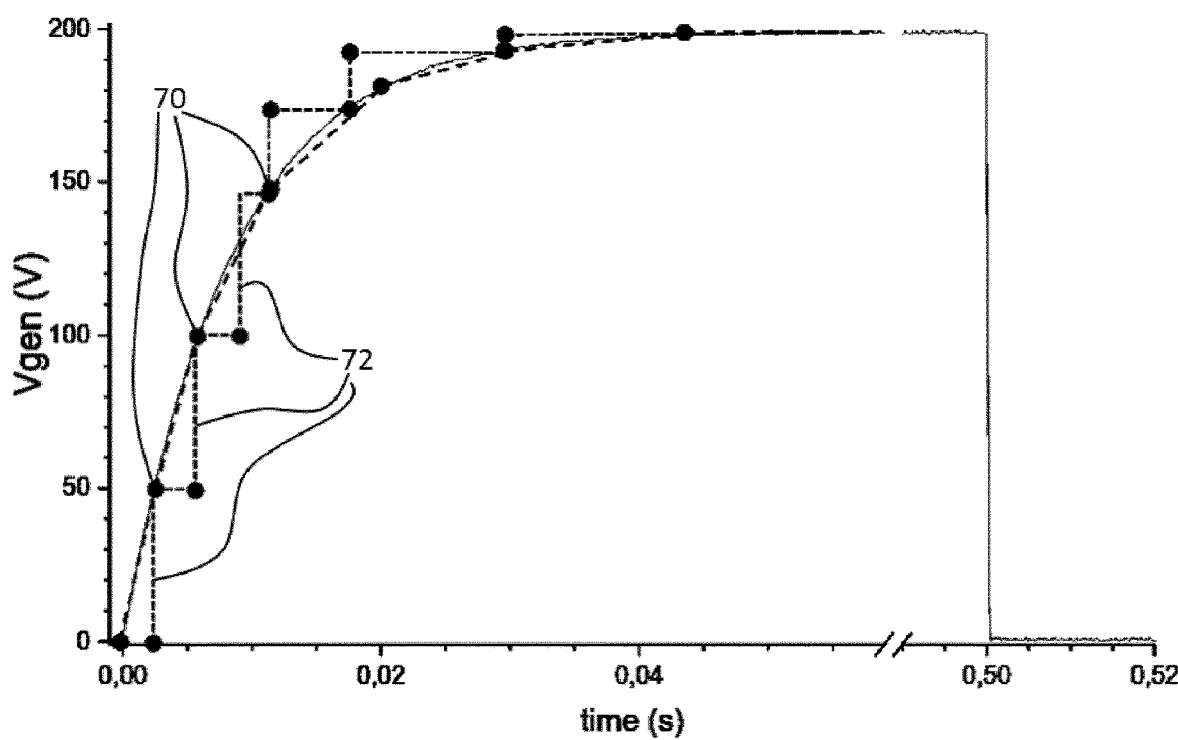
FIG. 27 shows how the waveform may be stepped or approximated rather than smooth.

The mathematical function may be realized by a gradual approximation. For example, a stepwise function may be used as shown in FIG. 27.

In this case, the function has a set of points 70 which define the decreasing gradient as explained above. There may be step increases between these points, as shown by steps 72 or there may be linear interpolations of intermediate values. Approximated or interpolated values may be exactly on the corresponding points of the smoothing function but also might be nearby. The voltage steps or interpolations need to be chosen in order not to generate any large oscillations. As a rule of thumb, the variation in voltage amplitude should not be larger than 25% of the maximum driving voltage amplitude.

Figure 28:
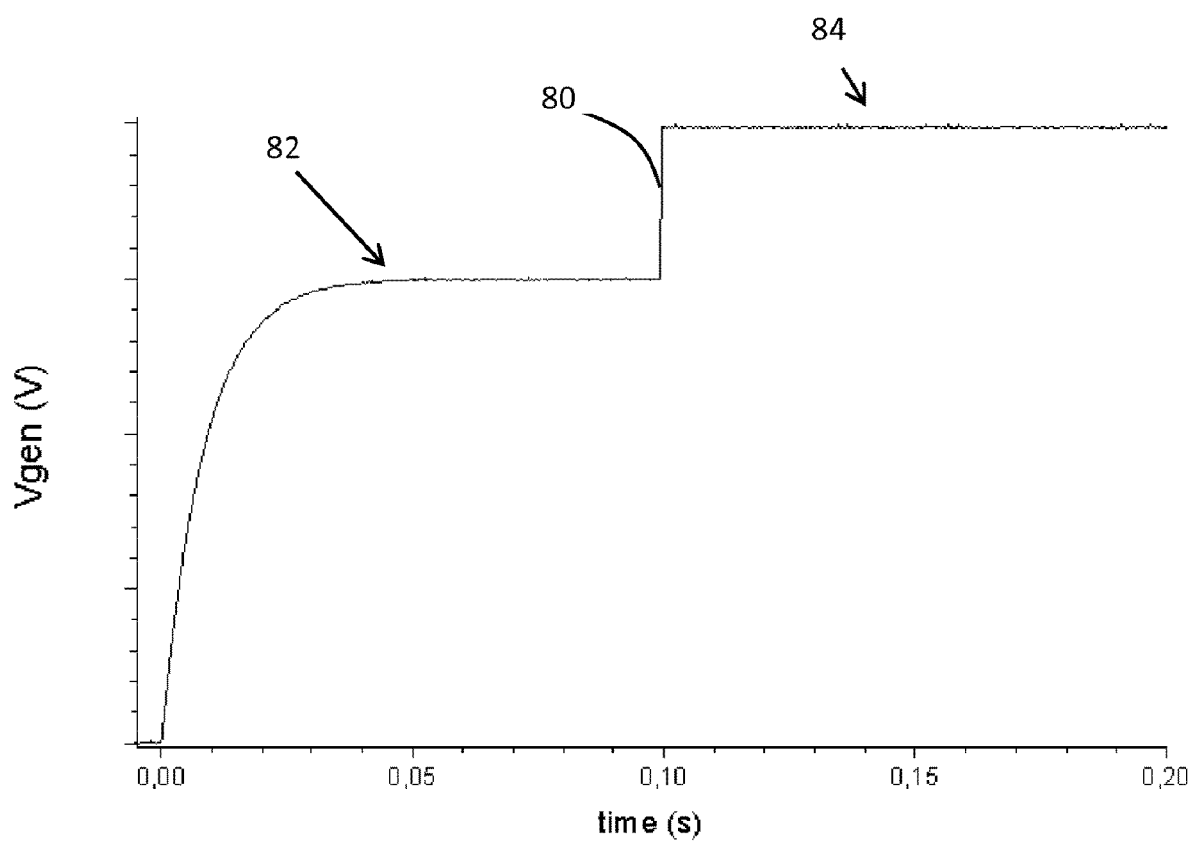
FIG. 28 shows that there may be a step after the voltage profile.

FIG. 28 shows that there may be a step portion 80 between the profiled portion 82 and the steady state portion 84 of the drive waveform. Although it may be preferred to provide a zero slope at the point of transition from the activation phase (the "profiled portion") to the steady state operation mode, a jump in the driving voltage as shown in FIG. 28 may be applicable. Depending on the tolerable level of oscillation (i.e. the amplitudes) and the threshold limits, the end point of the profiled portion may be below the required maximum operation voltage and a final step, or any other linear or non-linear increase, may be included to reach the end voltage. There may be such steps at any point in time during the activation phase.

For actuators with known oscillations, a specific driving signal may be generated. This driving signal may for example include an initial dc bias and a function dependent on the time period $t_{smooth}$ as indicated above. However, a third component may also be introduced in the form of an alternating signal superimposed on the function formed by the two first parameters. The alternating signal for example has a certain amplitude a, characteristic frequency f, an initial time delay $t_1$ and a phase delay $t_2$.

The superimposed alternating signal may be a sine wave in which case the signal will be defined by $$f(t) \begin{cases} 0, & \text{if } t \leq t_1 \\ a(t) * \sin(2\pi f * (t - t_2)), & \text{if } t > t_1 \end{cases}$$

The superimposed signal can have a length of several periods, n. The number of periods, n, may however be smaller than 1 and may be constant or include a damping factor so that the sine wave will slowly decay, as determined by the function a(t).

Preferably, the alternating voltage component is driven out of phase with the oscillations of the EAP (from a step input) in order to counteract the oscillations from the step voltage input. The frequency of the superimposed anti-oscillation voltage is then substantially the same as the resonance frequency of the actuated device or at least similar to the damped resonance frequency of the step voltage actuated device. The resonance frequency can be determined for a clamped actuator after manufacturing or can be calculated based on the geometry and material properties. The time constants $t_1$ and $t_2$ can be determined during a calibration procedure or via calculation.

Figure 29:
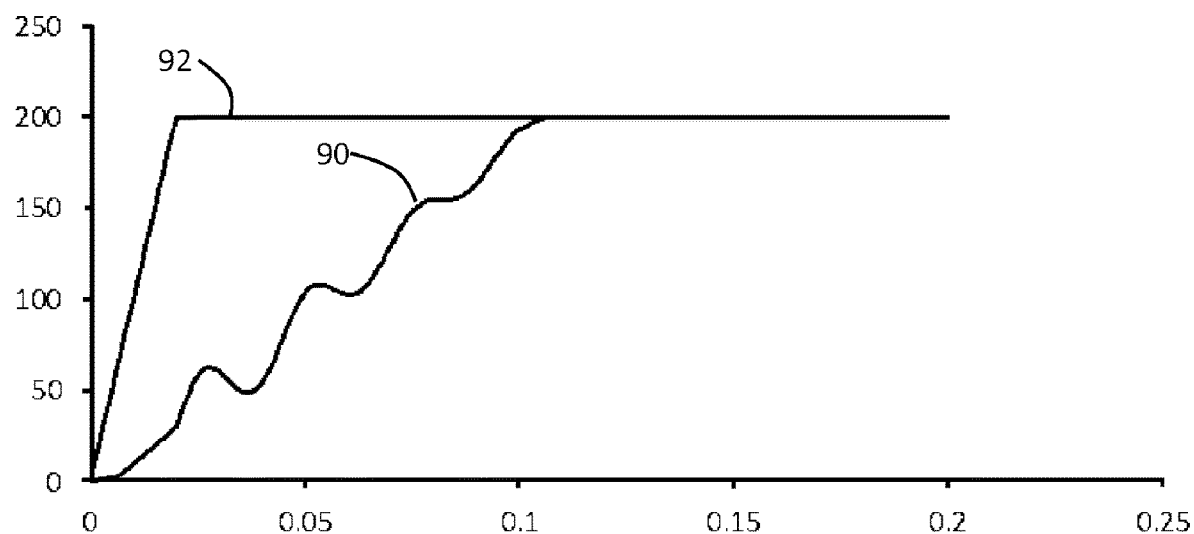
FIGS. 29 to 30 show the effect of applying a compensation voltage.
Figure 30:
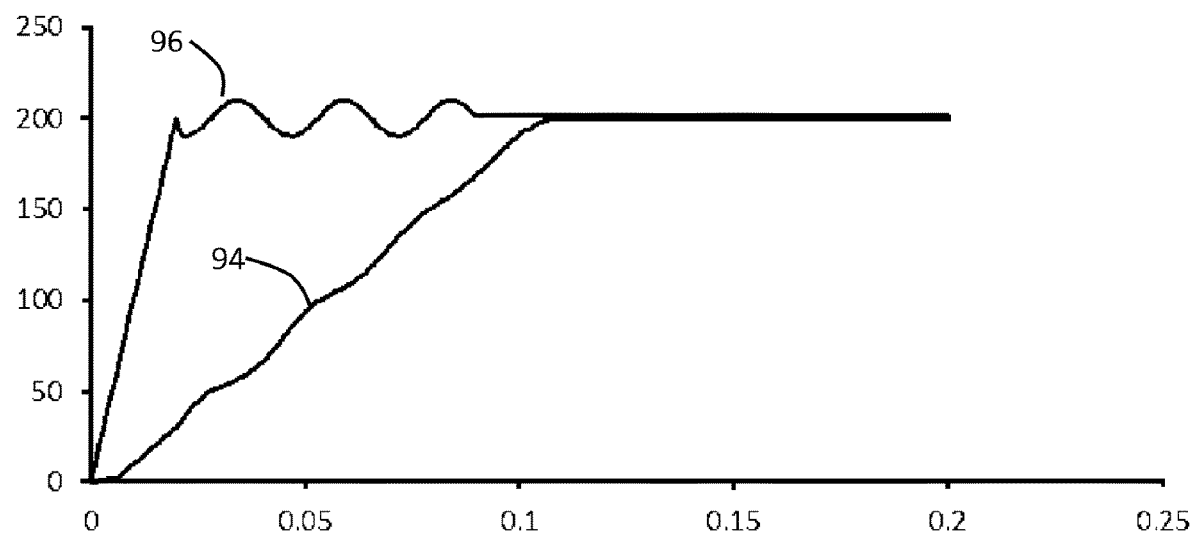

The procedure for calculating the suitable signal to superimpose will be different for low dc bias and high d bias actuation voltages. By way of example, FIG. 29 shows the response (plot 90) of an actuator in response to a clean ramp signal (plot 92). FIG. 30 show the response (plot 94) as a function of a ramp input voltage (plot 96) with a superimposed anti-oscillation voltage. This reduces the oscillations in the EAP actuator by counteracting the displacement.

In the above example the sinusoidal compensation is added to the already constant operation voltage, i.e. during the steady state voltage. Depending on the chosen slope of the applied driving voltage the compensation may be part of the profiled portion of the drive waveform.

In order to generate the required driving scheme several implementations may be used. Analogue circuits may be used or else a digital-microcontroller may calculate the required analogue data points which may be amplified by any conventional (power) amplifier solution. A look-up table approach may instead be implemented; where all required data points are already pre-calculated and saved in a memory of any controlling device. As a function of time, the digital or analogue data points are read out and may be amplified.

In the above examples, functions with specific response times have been considered for a specific actuator. The response times of the functions may be scaled with the resonance response of a random actuator. In particular, the time constants are substantially linearly related to the resonance frequency of the actuated device or at least similar to the damped resonance frequency of the step voltage actuated device. The resonance frequency can be determined for a clamped actuator after manufacturing or can be calculated based on geometry and material properties. The time constants $t_1$ and $t_2$ for the compensation signal as explained above can be determined during a calibration procedure or via calculation.

Figure 31:
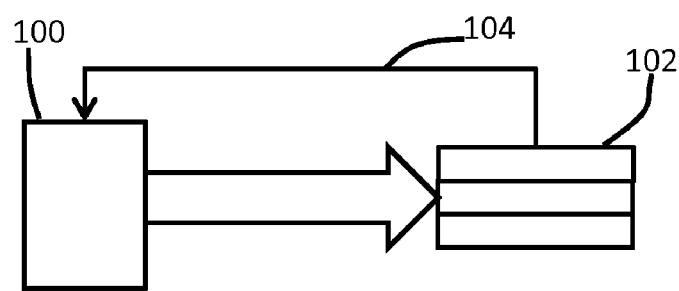
FIG. 31 shows an EAP actuator system.

FIG. 31 shows that a driver 100 is used to apply the drive voltage to the EAP actuator 102. It also shows an optional feedback path 104 (mechanical, optical or electrical).

The output of the driver 100 is the voltage profile as discussed above, namely before the load and any resistances connecting to the load. The voltage at the capacitive load will differ as a result of the series resistances between the driver and the load (or forming part of the load) and thus giving rise to RC charging time constants. Thus, the drive voltage is the direct output from the driver, and is the profile which the driver is designed to deliver as its output, for example to an open circuit output terminal.

This invention relates in particular to actuation of EAP actuators. However, it can be used in applications where an EAP device is performing both a sensing and an actuation function.

Materials suitable for the EAP layer are known. Electroactive polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF—HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels;

Measurements of physiological human body parameters such as heart beat, SpO2 and blood pressure.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude

The invention claimed is:

1. A field driven electroactive polymer actuator, comprising:
   an electroactive polymer structure; and
   a driver circuit,
      wherein the driver circuit is arranged to provide an actuation drive signal to the electroactive polymer structure,
      wherein the actuation drive signal comprises a drive voltage for charging the electroactive polymer structure from a non-actuated state to an actuated state,
      wherein the drive voltage comprises a profiled portion having a start voltage and an end voltage, and
      wherein the profiled portion comprises a voltage curve which defines a first voltage slope at the beginning of the profiled portion which is steeper than a linear ramp between the start voltage and the end voltage, and a second voltage slope at the end of the profiled portion which is shallower than the linear ramp between the start voltage and the end voltage and the profiled portion is applied for a duration of 10 ms to 100 ms followed by a steady state drive portion based on a steady state voltage.

2. The field driven electroactive polymer actuator as claimed in claim 1,
   wherein the driver circuit is arranged to provide the profiled portion which follows an initial step voltage increase from zero to the start voltage, and
   wherein the initial step voltage increase is at most 50% of the end voltage.

3. The field driven electroactive polymer actuator as claimed in claim 1,
   wherein the driver circuit is arranged to provide the profiled portion which comprises a smooth curve with monotonically decreasing gradient.

4. The field driven electroactive polymer actuator as claimed in claim 1,
   wherein the driver is arranged to provide the profiled portion, and
   wherein the profiled portion comprises a set of at least 4 voltage steps between voltage points.

5. The field driven electroactive polymer actuator as claimed in claim 1,
   wherein the driver circuit is arranged to provide the profiled portion of the drive voltage to the electroactive polymer structure, and
   wherein the profiled portion has a duration of between 10 ms and 200 ms.

6. The field driven electroactive polymer actuator as claimed in claim 1,
   wherein the driver circuit is arranged to provide the end voltage, and
   wherein the end voltage is equal to the steady state voltage.

7. The field driven electroactive polymer actuator as claimed in claim 1,
   wherein the driver circuit is arranged to provide a compensation waveform which is superposed over the profiled portion.

8. The field driven electroactive polymer actuator as claimed in claim 1,
   wherein the driver circuit is arranged to provide the profiled portion, and
   wherein the profiled portion comprises:
      a parabolic curve; or
      an exponential curve; or
      a root curve.

9. The field driven electroactive polymer actuator as claimed in claim 1,
   wherein the profiled portion comprises a set of voltage points which define the first voltage slope at the beginning of the profiled portion which is steeper than the linear ramp between the start voltage and the end voltage, and the second voltage slope at the end of the profiled portion which is shallower than the linear ramp between the start voltage and the end voltage.

10. The field driven electroactive polymer actuator as claimed in claim 1,
    wherein the driver is arranged to provide the profiled portion, and
    wherein the profiled portion comprises a set of at least 4 constant slope portions between voltage points.

11. The field driven electroactive polymer actuator as claimed in claim 1,
    wherein the driver circuit is arranged to provide a step increase from the end voltage to the steady state voltage.

12. The field driven electroactive polymer actuator as claimed in claim 1,
    wherein the driver circuit is arranged to provide a compensation waveform which is superposed over the steady state voltage.

13. A method of driving a field driven electroactive polymer actuator structure, comprising:
    providing an actuation drive signal to the electroactive polymer structure, the actuation drive signal comprising:
       a profiled portion having a start voltage and an end voltage,
       wherein the profiled portion comprises a voltage curve which defines a first voltage slope at the beginning of the profiled portion which is steeper than a linear ramp between the start voltage and the end voltage, and a second voltage slope at the end of the profiled portion which is shallower than the linear ramp between the start voltage and the end voltage and the profiled portion is applied for a duration of 10 ms to 100 ms followed by a steady state drive portion based on a steady state voltage.

14. The method as claimed in claim 13, further comprising:
    providing the profiled portion which follows an initial step voltage increase from zero to the start voltage, wherein the initial step voltage increase is at most 50% of the end voltage.

15. The method as claimed in claim 13, further comprising:
    providing a compensation waveform which is superposed over the profiled portion.

16. The method as claimed in claim 13, further comprising:
    providing the profiled portion which comprises: a smooth curve with a monotonically decreasing gradient or a set of at least 4 voltage steps between voltage points or a set of at least 4 constant slope portions between voltage points.

17. The method as claimed in claim 13, further comprising providing the profiled portion of the actuation drive signal to the electroactive polymer structure, wherein the profiled portion has a duration of between 10 ms and 200 ms.

18. The method as claimed in claim 13, further comprising:
provIding the end voltage which is equal to the steady state voltage; or
providing a step increase from the end voltage to the steady state voltage.

19. The method as claimed in claim 13,
wherein the profiled portion comprises a set of voltage points which define the first voltage slope at the beginning of the profiled portion which is steeper than the linear ramp between the start voltage and the end voltage, and the second voltage slope at the end of the profiled portion which is shallower than the linear ramp between the start voltage and the end voltage.

20. The method as claimed in claim 13, further comprising:
providing a compensation waveform which is superposed over the steady state voltage.

\* \* \* \* \*